United States Patent
Song

(10) Patent No.: US 12,212,832 B2
(45) Date of Patent: Jan. 28, 2025

(54) CAMERA MODULE

(71) Applicant: LG INNOTEK CO., LTD., Seoul (KR)

(72) Inventor: Young Kil Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 875 days.

(21) Appl. No.: 17/298,226

(22) PCT Filed: Dec. 13, 2019

(86) PCT No.: PCT/KR2019/017669
§ 371 (c)(1),
(2) Date: May 28, 2021

(87) PCT Pub. No.: WO2020/122660
PCT Pub. Date: Jun. 18, 2020

(65) Prior Publication Data
US 2022/0113608 A1    Apr. 14, 2022

(30) Foreign Application Priority Data

Dec. 13, 2018  (KR) .................. 10-2018-0161260
Dec. 13, 2018  (KR) .................. 10-2018-0161261

(51) Int. Cl.
*H04N 23/55* (2023.01)
*H04N 13/246* (2018.01)
(Continued)

(52) U.S. Cl.
CPC .......... *H04N 23/55* (2023.01); *H04N 13/246* (2018.05); *H04N 23/51* (2023.01); *H04N 23/54* (2023.01); *H04N 23/57* (2023.01); *H04N 23/58* (2023.01); *H05K 1/189* (2013.01); *H05K 2201/10121* (2013.01)

(58) Field of Classification Search
CPC ...... G01S 17/08; G01S 17/894; G01S 7/4813; G03B 13/20; G03B 2205/0023;
(Continued)

(56) References Cited

U.S. PATENT DOCUMENTS 5,834,761 A * 11/1998 Okada ................. G03B 5/00
                                                    359/557
11,962,877 B2 * 4/2024 Topliss ................ G02B 7/08
(Continued)

FOREIGN PATENT DOCUMENTS

CN    103472660 A    12/2013
CN    108474924 A    8/2018
(Continued)

*Primary Examiner* — Amy R Hsu
(74) *Attorney, Agent, or Firm* — Birch, Stewart, Kolasch & Birch, LLP

(57) ABSTRACT

The present embodiment relates to a camera module, comprising: a housing; an elastic member; a holder; a magnet; a coil; a lens module; and a filter, wherein the magnet comprises a first magnet, a second magnet disposed opposite to the first magnet, a third magnet, and a fourth magnet disposed opposite to the third magnet, and wherein the coil comprises a first coil facing the first magnet, a second coil facing the second magnet, a third coil facing the third magnet, and a fourth coil facing the fourth magnet, and wherein the first to fourth coils are independently applied with a current, and the filter is tilted to a diagonal direction by control of a current applied to the first and third coils.

14 Claims, 21 Drawing Sheets

(51) Int. Cl.
*H04N 23/51* (2023.01)
*H04N 23/54* (2023.01)
*H04N 23/57* (2023.01)
*H04N 23/58* (2023.01)
*H05K 1/18* (2006.01)

(58) Field of Classification Search
CPC .. G03B 2205/0069; G03B 30/00; G03B 5/00; H04N 13/246; H04N 23/51; H04N 23/54; H04N 23/55; H04N 23/57; H04N 23/58; H05K 1/189; H05K 2201/10121; H05K 2201/2009
See application file for complete search history.

(56) References Cited

U.S. PATENT DOCUMENTS

| | | |
|---|---|---|
| 2011/0286099 A1 | 11/2011 | Shiraki et al. |
| 2012/0147258 A1 | 6/2012 | Park |
| 2016/0150137 A1* | 5/2016 | Park ............... H04N 23/55 348/374 |
| 2019/0011614 A1 | 1/2019 | Park et al. |
| 2019/0101722 A1 | 4/2019 | Aranai |
| 2019/0377155 A1* | 12/2019 | Bachar ............... G02B 7/08 |

FOREIGN PATENT DOCUMENTS

| | | |
|---|---|---|
| JP | 7-274070 A | 10/1995 |
| JP | 2014-115493 A | 6/2014 |
| JP | 2017-111377 A | 6/2017 |
| JP | 2017-161609 A | 9/2017 |
| KR | 1999-0055043 A | 7/1999 |
| KR | 10-2012-0066264 A | 6/2012 |
| KR | 10-2013-0041634 A | 4/2013 |
| KR | 10-2016-0001576 A | 1/2016 |
| KR | 10-2018-0007462 A | 1/2018 |
| KR | 10-2018-0118720 A | 10/2018 |

* cited by examiner (a)

(b)

(a)            (b)

(a)  (b)

(a)

(b)

(c)

(e)

(d)

CAMERA MODULE

CROSS REFERENCE TO RELATED APPLICATIONS

This application is the National Phase of PCT International Application No. PCT/KR2019/017669, filed on Dec. 13, 2019, which claims priority under 35 U.S.C. 119 (a) to Patent Application Nos. 10-2018-0161260 and 10-2018-0161261, both filed in the Republic of Korea on Dec. 13, 2018, all of which are hereby expressly incorporated by reference into the present application.

TECHNICAL FIELD

The present embodiment relates to a camera module.

BACKGROUND ART

The 3D (three-dimensional) contents are applied to various fields comprising games, cultures, education, manufacturing and self-driving as well. In order to obtain the 3D contents, a depth map is required. The depth map is information that indicates a spatial distance and shows perspective (far and near) information of a point with respect to another point in a two-dimensional image.

A time-of-flight (TOF) method is gaining attention of late, as a technology for acquiring depth information. According to the TOF method, a distance from an object is calculated by measuring time of flight, i.e., the time taken for emitted light to be reflected. The strongest point of TOF is that it can provide distance information to a 3D space fast and in real time. Furthermore, another strong point is that a user can obtain accurate distance information without a separate algorithm application or hardware correction. Moreover, accurate depth information can be acquired even if measuring a very close object or a moving object.

However, there is a disadvantage in the current TOF method in that information obtainable for each frame, that is, resolution, is low.

The number of pixels may be increased in order to enhance the resolution, but another disadvantage occurs that volume of a camera module increases and a manufacturing cost increases.

DETAILED DESCRIPTION OF THE INVENTION

Technical Subject

The present exemplary embodiment is to provide a camera module configured to increase resolution by being used to a TOF method.

To be more specific, the present exemplary embodiment is to provide a camera module configured to implement an SR (Super Resolution) technology.

Moreover, the present exemplary embodiment is to provide a camera module comprising a coil of electrically conductive structure.

Technical Solution

A camera module according to an exemplary embodiment may comprise: a housing; an elastic member connected to the housing; a holder connected to the elastic member; a magnet disposed on the holder; a coil facing the magnet; a lens module coupled with the housing; and a filter coupled with the holder, wherein the magnet comprises a first magnet, a second magnet disposed opposite to the first magnet, a third magnet, and a fourth magnet disposed opposite to the third magnet, and wherein the coil comprises a first coil facing the first magnet, a second coil facing the second magnet, a third coil facing the third magnet, and a fourth coil facing the fourth magnet, and wherein the first to fourth coils are independently applied with a current, and the filter may be tilted to a diagonal direction by control of a current applied to the first and third coils.

The second holder may comprise a first lateral surface, a second lateral surface disposed opposite to the first lateral surface, and a third lateral surface and a fourth lateral surface disposed opposite to the first and second lateral surfaces between the first and second lateral surfaces, wherein the first magnet may be disposed at the first lateral surface of the holder, the second magnet may be disposed at the second lateral surface of holder, the third magnet may be disposed at the third lateral surface of holder, and the fourth magnet may be disposed at the fourth lateral surface of holder and the first to fourth coils may be coupled with the housing.

The filter may be so disposed as to allow being tilted to a diagonal direction by a current being applied to adjacent two coils among the first to fourth coils.

The holder may comprise a first corner part disposed between the first lateral surface and the third lateral surface, a second corner part disposed between the second lateral surface and the third lateral surface, a third corner part disposed between the second lateral surface and the fourth lateral surface, and a fourth corner part disposed between the fourth lateral surface and the first lateral surface, and the filter may comprise a first corner disposed at a position corresponding to that of the first corner part of the holder, and the first corner of the filter may be tilted upward of an optical axis by the first coil and the third coil.

The filter may comprise a third corner disposed at a position corresponding to that of the third corner part of holder, the third corner of the filter may be tilted downward of an optical axis by the second coil and the fourth coil, and the first corner of filter may be further tilted upward of the optical axis by the second coil and the fourth coil.

The filter may be such that two adjacent coils among the first to fourth coils may be applied with a forward current, and the other remaining coils may be applied with a reverse current to allow being tilted to a diagonal direction of the filter.

The elastic member may comprise a first coupling part coupled to an upper surface of holder, a second coupling part coupled to an upper surface of housing, and an upper elastic member comprising a connection part connecting the first coupling part and the second coupling part, wherein the first coupling part of the upper elastic member may be coupled to a corner of the holder, and the second coupling part of the upper elastic member may be coupled to a corner of the housing corresponding to another corner of holder adjacent to the corner of the holder.

The elastic member may comprise a first coupling part coupled to a lower surface of holder, a second coupling part coupled to a lower surface of housing, a lower elastic member comprising a connection part connecting the first coupling part and the second coupling part, and the first coupling part of the lower elastic member may be coupled with other corners of holder.

The first coupling part of the elastic member may comprise two pieces of first coupling part, the said two pieces of first coupling part may be symmetrically disposed to an optical axis on a first diagonal direction of filter, the second coupling part of elastic member may comprise two pieces of second coupling part, and the said two pieces of second coupling part may be symmetrically disposed to the optical axis on a second diagonal direction different from the first diagonal direction of the filter.

The holder may comprise a first corner disposed between the first lateral surface and the third lateral surface, a second corner disposed between the second lateral surface and the third lateral surface, a third corner disposed between the second lateral surface and the fourth lateral surface, and a fourth corner disposed between the fourth lateral surface and the first lateral surface, wherein the housing may comprise a first corner corresponding to the first corner of holder, a second corner corresponding to the second corner of holder, a third corner corresponding to the third corner of holder, and a fourth corner corresponding to the fourth corner of holder, wherein the first coupling part of elastic member may be coupled respectively to the first corner of holder and to the third corner of holder, and the second coupling part of elastic member may be coupled respectively to the second corner of housing and to the fourth corner of housing.

The housing may comprise an internal part coupled with a lens module, an external part disposed with the coil, and a connection part connecting the internal part with the external part to be at least partially overlapped with the holder to an optical axis direction.

The connection part of housing may be disposed on a part of the holder, the housing may comprise a hole formed on a first diagonal direction of the filter, the holder may comprise a protrusion formed on an upper surface of holder to allow passing through the hole, and the protrusion of the holder may be coupled with the first coupling part.

The holder may comprise a groove on an upper surface of the holder formed about the protrusion, and the housing may comprise a first surface at an inside of the protrusion to face the protrusion, and the first surface of housing may be formed with a recess part having a curvature corresponding to that of the protrusion.

Mutually facing and parallel disposed tapered surfaces may be formed at a lower end of the internal part of housing and at an area corresponding to the holder.

The magnet may be more protruded than an outside surface of holder.

A camera module according to an exemplary embodiment may comprise: a housing comprising a base; an elastic member connected to the housing; a holder connected to the elastic member; a magnet disposed on the holder; a coil facing the magnet; a lens module coupled with the housing; and a filter coupled with the holder, wherein the holder may be spaced apart from the base of housing, and tiltable by being coupled with the elastic member to a first diagonal direction of the filter.

The holder may be spaced apart from the housing.

The holder and the housing may be connected by the elastic member.

A camera module according to an exemplary embodiment may comprise: a housing; a first elastic member connected to the housing; a holder connected to the first elastic member; a magnet disposed on the holder; a coil facing the magnet; a lens module coupled with the housing; and a filter coupled with the holder, wherein the magnet may comprise a first magnet, a second magnet disposed opposite to the first magnet, a third magnet, and a fourth magnet disposed opposite to the third magnet, and wherein the coil may comprise a first coil facing the first magnet, a second coil facing the second magnet, a third coil facing the third magnet, and a fourth coil facing the fourth magnet, and wherein the first to fourth coils may be independently applied with a current, and the first elastic member may be coupled with the housing on a first diagonal direction of filter, and may be coupled with the holder on a second diagonal direction of filter.

The camera module may further comprise a second elastic member coupled to a lower surface of housing and to a lower surface of holder, and the first elastic member may be coupled to an upper surface of housing and to an upper surface of holder, and the second elastic member may be coupled with the housing on a second diagonal direction of the filter and coupled with the holder on a first diagonal direction of filter.

A camera module according to an exemplary embodiment may comprise: a housing comprising a lateral wall and a hole formed on the lateral wall; an elastic member connected to the housing; a holder connected to the elastic member; a magnet disposed on the holder; a coil facing the magnet; a lens module coupled with the housing; a filter coupled with the holder; and a substrate disposed on the housing, wherein the substrate may be disposed on the lateral wall of housing, and the coil may be coupled with the substrate to be disposed on the hole of lateral wall of housing.

The camera module may comprise an upper plate comprising a hole, and a cover comprising a lateral plate extended from the upper plate, wherein the substrate may be interposed between the lateral plate of cover and the lateral wall of housing.

The lateral plate of cover may comprise a bent part contacting the substrate by allowing a part of the lateral plate of cover to be inwardly bent.

The substrate may comprise a body part coupled by the coil, an extension part upwardly extended from the body part, and a terminal part formed with a plurality of terminals by being downwardly extended from the body part, wherein the lateral wall of housing may comprise a first protrusion overlapped with the substrate to an optical axis direction and disposed on the extension part of the substrate.

The lateral wall of housing may comprise a second protrusion downwardly extended from a distal end of the first protrusion of lateral wall of housing to be overlapped with the extension part of substrate to a direction perpendicular to an optical axis direction.

The lateral wall of housing may comprise a staircase part protrusively formed on both sides of the terminal part, wherein the staircase part on the lateral wall of housing may be overlapped with the substrate to an optical axis direction and disposed underneath a part of the substrate.

The hole of housing may have a shape corresponding to that of the coil, and the lateral wall of housing may comprise a first groove formed by being upwardly recessed from the hole of the lateral wall of housing, and a second groove formed by being downwardly recessed from the hole of lateral wall of housing, the coil may comprise a first terminal and a second terminal coupled with the substrate, and the first terminal of coil may be disposed on the first groove of housing and the second terminal of coil may be disposed on the second groove of housing.

The lateral wall of housing may comprise first to fourth lateral walls, a hole of the lateral wall of housing may be formed on each of the first to fourth lateral walls, the magnet may comprise a first magnet, a second magnet disposed opposite to the first magnet, and third and fourth magnets disposed between the first magnet and the second magnet in mutually opposite sides, the coil may comprise a first coil disposed on the hole of the first lateral wall of housing to face the first magnet, a second coil disposed on the hole of the second lateral wall of housing to face the second magnet, a third coil disposed on the hole of the third lateral wall of housing to face the third magnet, and a fourth coil disposed on the hole of fourth lateral wall of housing to face the fourth magnet.

The lateral wall of housing may comprise first to fourth lateral walls, the substrate may comprise a first part disposed on the first lateral wall of housing, a second part disposed on the second lateral wall of housing, a third part disposed on the third lateral wall of housing, and a fourth part disposed on the fourth lateral wall of housing, the third part of substrate may connect the first part of substrate and the second part of substrate, the second part of substrate may connect the third part of substrate and the fourth part of substrate, the first part and the second part of substrate may be spaced apart, a distal end of first part of substrate and a distal end of fourth part of substrate may be disposed on a protrusion protrusively formed on a corner where the first lateral wall of housing and the fourth lateral wall meets.

A camera module according to an exemplary embodiment may comprise: a cover comprising an upper plate comprising a hole and a lateral plate extended from the upper plate; a housing disposed at least a part within the cover and comprising a lateral wall; an elastic member connected to the housing; a holder connected to the elastic member; a magnet disposed on the holder; a coil facing the magnet; a lens module coupled with the housing; a filter coupled with the holder; and a substrate coupled with the coil to be disposed on the housing, wherein the substrate may be interposed between the lateral wall of housing and the lateral plate of cover, the lateral plate of cover may comprise a recessed part contacting the substrate by being inwardly recessed at a part of the lateral plate of cover.

Advantageous Effects

The exemplary embodiment of the present invention has an advantageous effect in that depth information can be acquired with a high resolution even without a marked increase of the number of pixels on a sensor.

Furthermore, the exemplary embodiment of the present invention has another advantageous effect in that an image of high resolution can be acquired through an SR technique from a plurality of images of low resolution obtained from a camera module according to an exemplary embodiment of present invention.

Still furthermore, the exemplary embodiment of the present invention has another advantageous effect in that an electrically conductive structure of coil can be provided to minimize an assembly tolerance of coils.

BEST MODE

Figure 1:
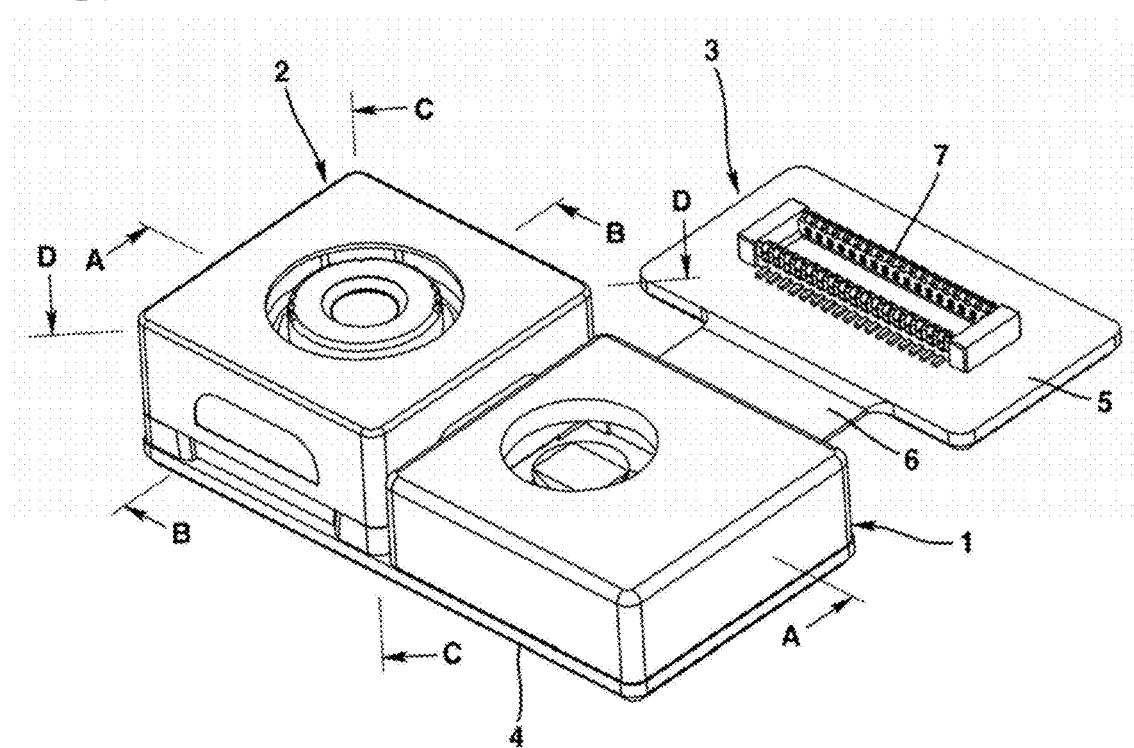
FIG. 1 is a perspective view of a camera module according to an exemplary embodiment of the present invention.

Some exemplary embodiments of present invention will be described in detail with reference to the accompanying drawings.

The technical ideas of the present invention are not intended to limit some exemplary embodiments of the present invention, and may be realized in mutually different forms, and may be used by being selectively coupled or substituted with one or more elements among elements in the exemplary embodiments.

Unless otherwise defined, all terms (comprising technical and scientific terms) used herein have the same meaning as commonly understood by one of ordinary skill in the art to which exemplary embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Furthermore, the terminology used herein is for the purpose of describing particular embodiments only and is not intended to be limiting of exemplary embodiments.

As used herein, the singular forms "a", "an", and "the" are intended to comprise the plural forms as well, unless context clearly indicates otherwise, and in case of describing at least one (or one or more than one) among "A and B, C, one or more combinations may be comprised among all combinations combinable by A, B and C.

In describing elements in the exemplary embodiments of the present invention, the terms, first, second, A, B (a), (b), etc., may be used. These terms may be used only to distinguish one element from another element, and the nature, order or sequence is not restricted by these terms.

When an element is referred to as being "accessed to", "coupled to," or "connected to," another element, it should be appreciated that the element may be directly accessed, connected or coupled to the other element, or intervening elements may be present therebetween.

Furthermore, references to a structure being formed "on", "above", "lower", or "bottom" of another structure or portion contemplates not only that two elements are mutually and directly contacted, but also that one or more other elements may be formed or disposed thereamong. In addition, when an expression of "on (above) or lower (bottom) is described, it means that an upper direction and a lower direction are also comprised based on one element.

Now, an optical apparatus according to a present embodiment will be described.

An optical apparatus may be any one of a hand phone, a mobile phone, a smart phone, a portable smart device, a digital camera, a notebook computer (laptop computer), a digital broadcasting terminal, a PDA (Personal Digital Assistant), a PMP (Portable Multimedia Player) and a navigation device. However, the present invention is not limited thereto, and the optical apparatus may comprise any device capable of capturing an image or a photograph.

The optical apparatus may comprise a main body. The main body may take a bar shape. Alternatively, the main body may take various structures comprising a slide type where more than two sub-bodies are relatively and movably coupled, a folder type, a swing type and swivel type. The main body may comprise a case (casing, a housing, a cover) forming an external look. For example, the main body may comprise a front case, and a rear case. A space formed between the front case and the rear case may be embedded with various electronic parts of the optical apparatus.

The optical apparatus may comprise a display. The display may be disposed on one surface of main body at the optical apparatus. The display may output an image. The display may output an image captured by a camera.

The optical apparatus may comprise a camera. The camera may comprise a ToF (Time of Flight) camera device. ToF camera device may be disposed at a front surface of main body. In this case, the ToF camera device may be used in biometric recognition of various methods comprising facial recognition of a user for security certification of an optical apparatus and iris recognition.

Now, configuration of ToF camera device according to a present embodiment will be described with reference to the accompanying drawings.

Figure 2:
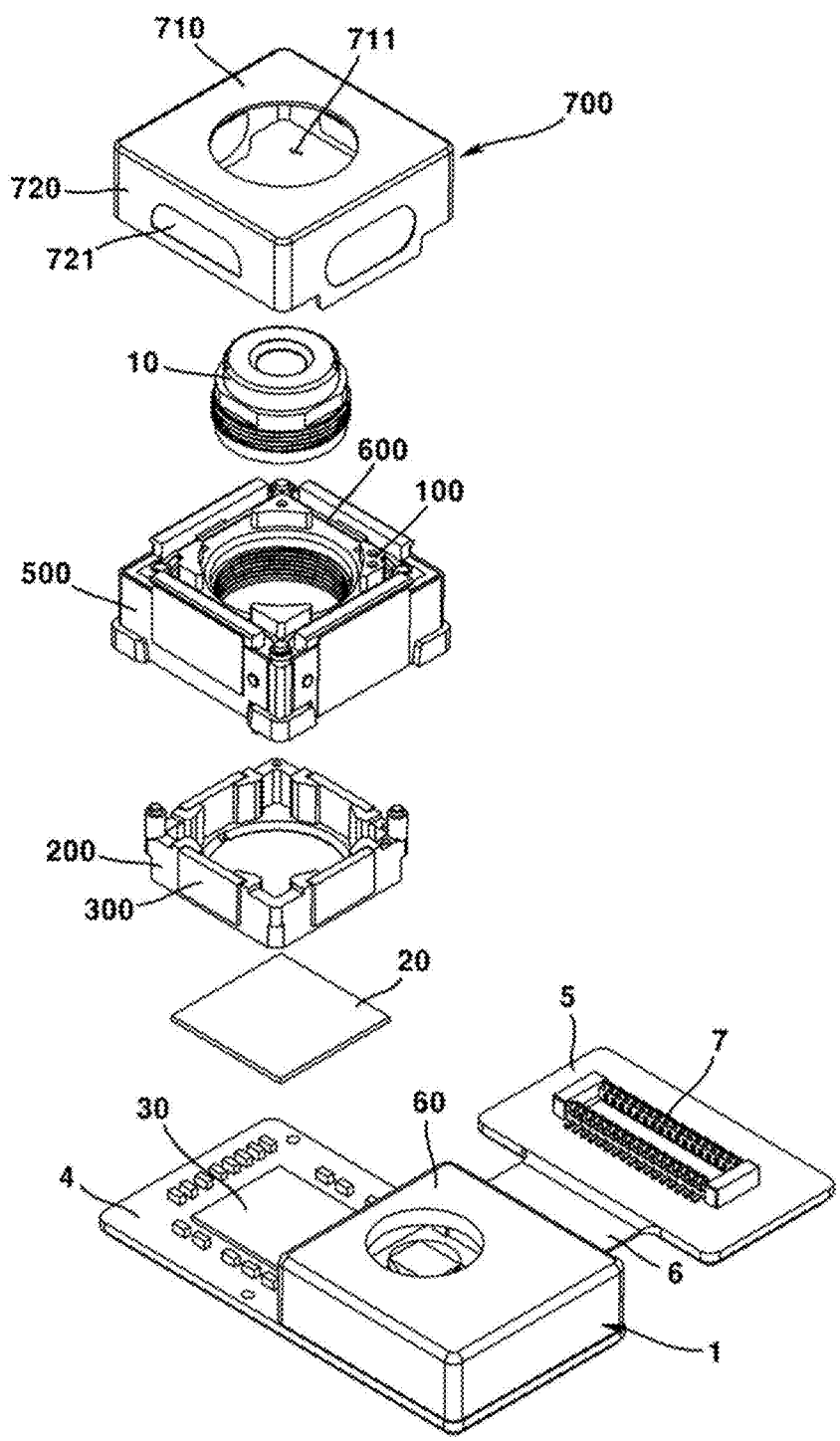
FIG. 2 is an exploded perspective view of a camera module according to an exemplary embodiment of the present invention.
Figure 3A:
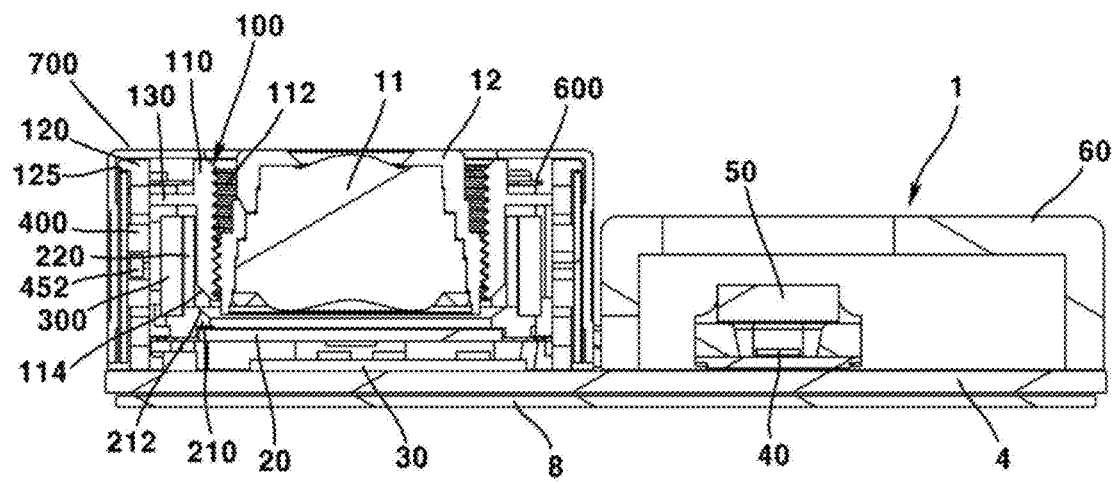
FIG. 3a is a cross-sectional view of a camera module taken along line A-A of FIG. 1 according to an exemplary embodiment of the present invention.
Figure 3B:
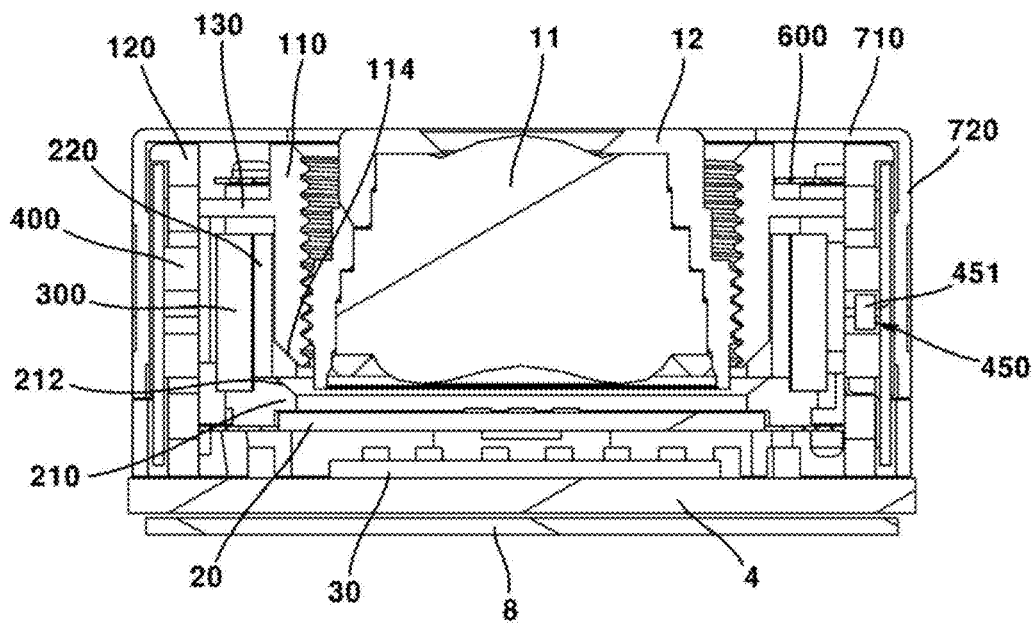
FIG. 3b is a cross-sectional view of a camera module taken along line B-B of FIG. 1 according to an exemplary embodiment of the present invention.
Figure 4A:
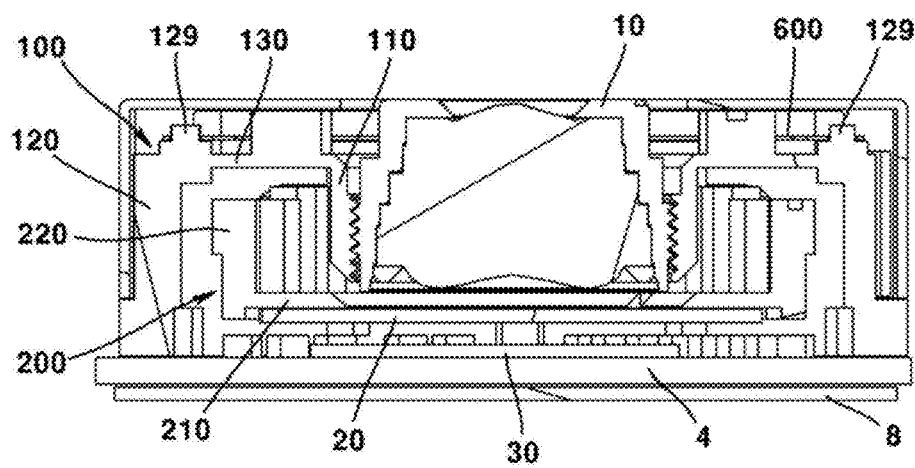
FIG. 4a is a cross-sectional view of a camera module taken along line C-C of FIG. 1 according to an exemplary embodiment of the present invention.
Figure 4B:
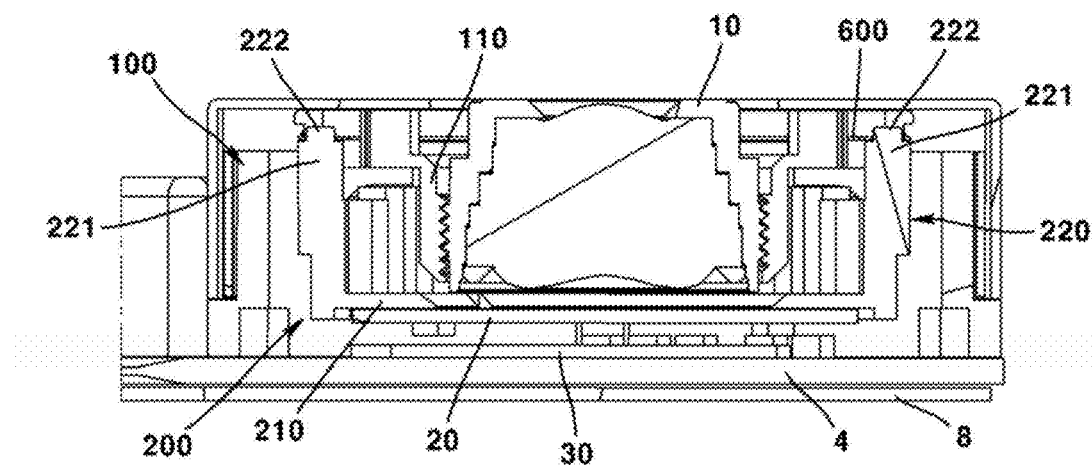
FIG. 4b is a cross-sectional view of a camera module taken along line D-D of FIG. 1 according to an exemplary embodiment of the present invention.
Figure 5:
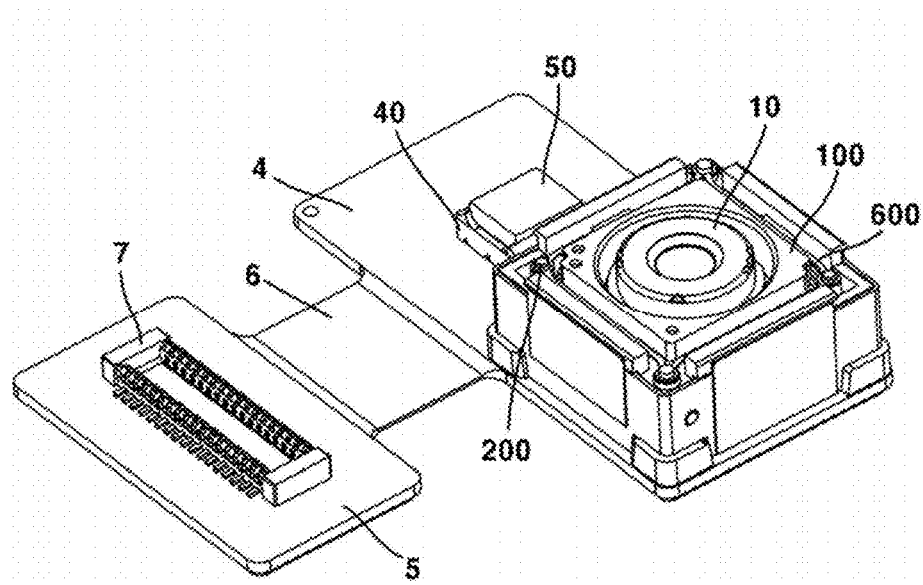
FIG. 5 is a perspective view of a partial configuration of a camera module according to an exemplary embodiment of the present invention.
Figure 6:
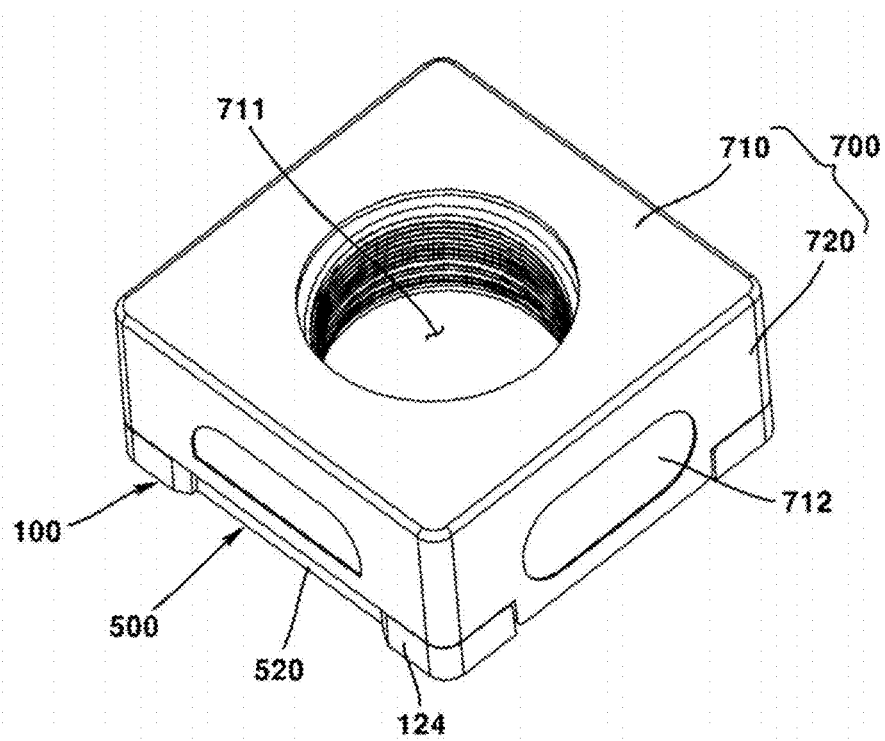
FIG. 6 is a perspective view of a partial configuration of a light receiving part of a camera module according to an exemplary embodiment of the present invention.
Figure 7:
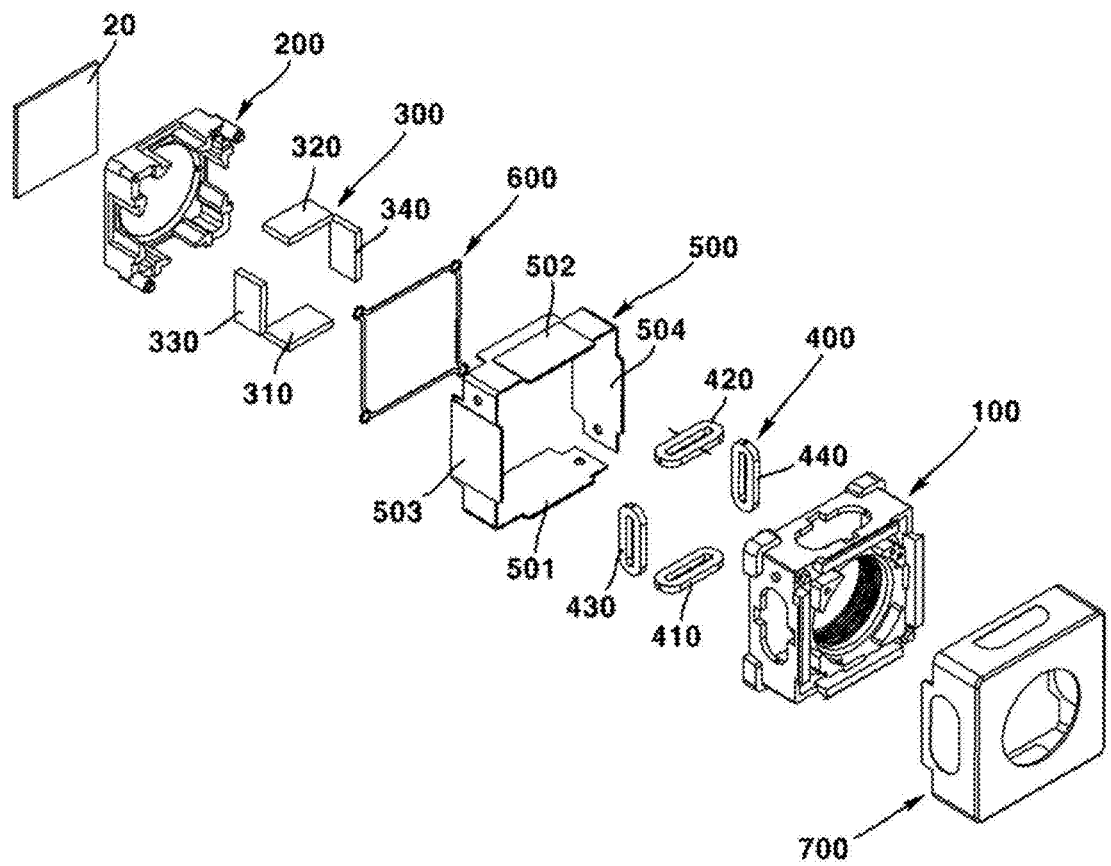
FIG. 7 is an exploded perspective view of a partial configuration of a light receiving part of a camera module of FIG. 6 according to an exemplary embodiment of the present invention.
Figure 8:
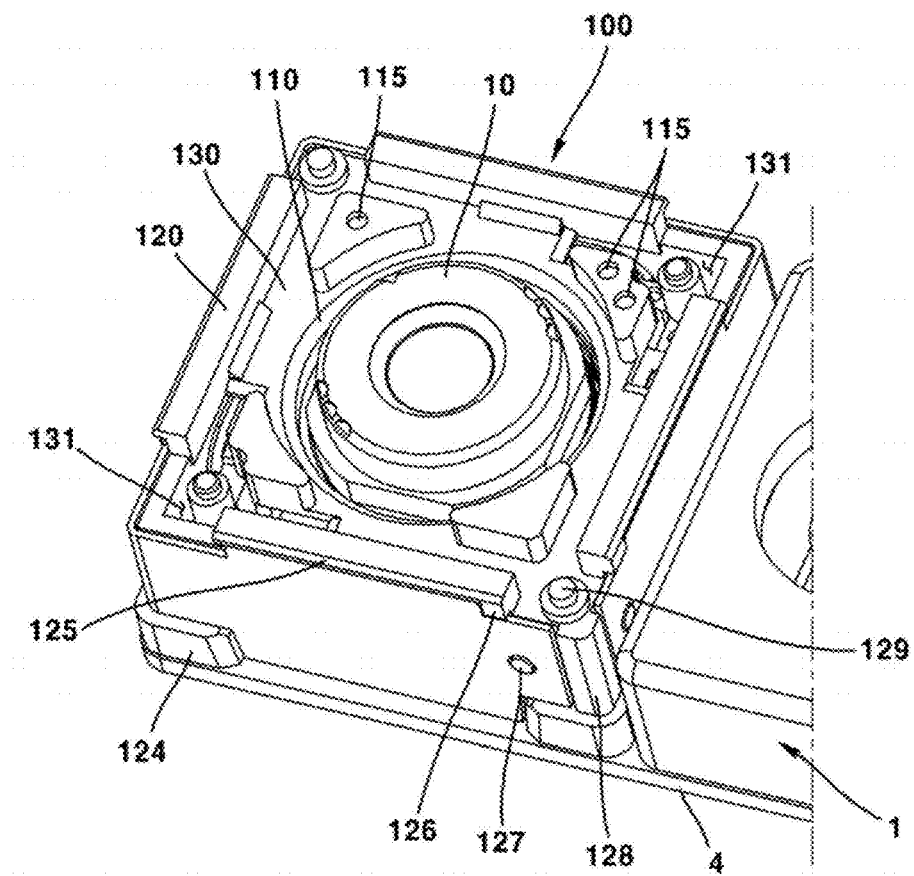
FIG. 8 is a perspective view of a partial configuration of a camera module according to an exemplary embodiment of the present invention.
Figure 9:
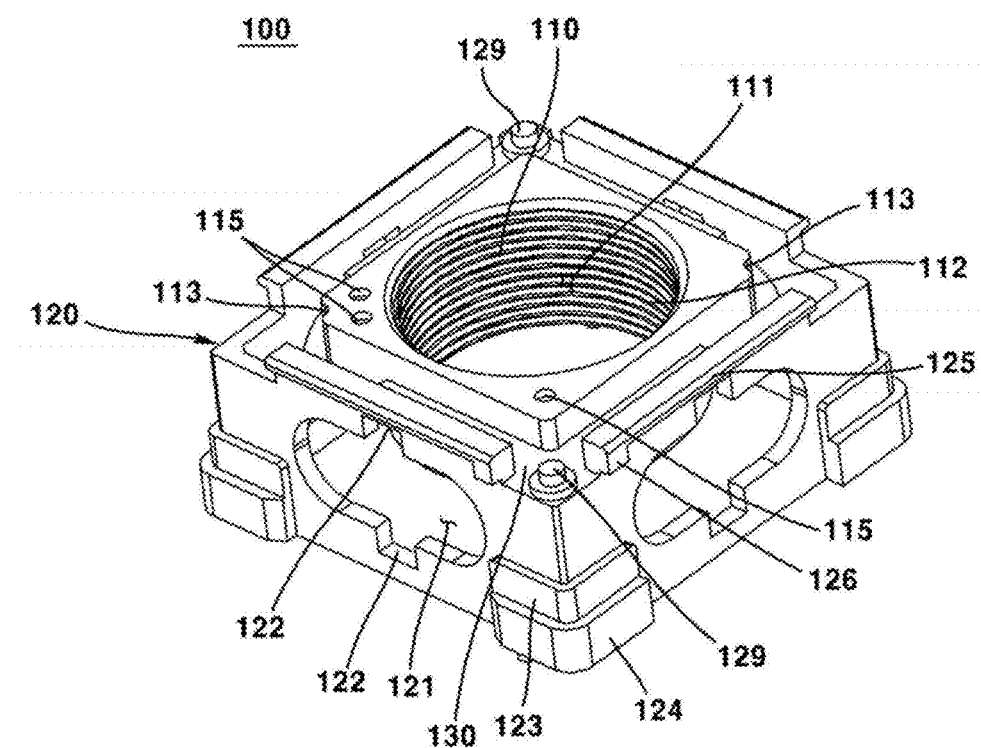
FIG. 9 is a perspective view of a housing of a camera module according to an exemplary embodiment of the present invention.
Figure 10:
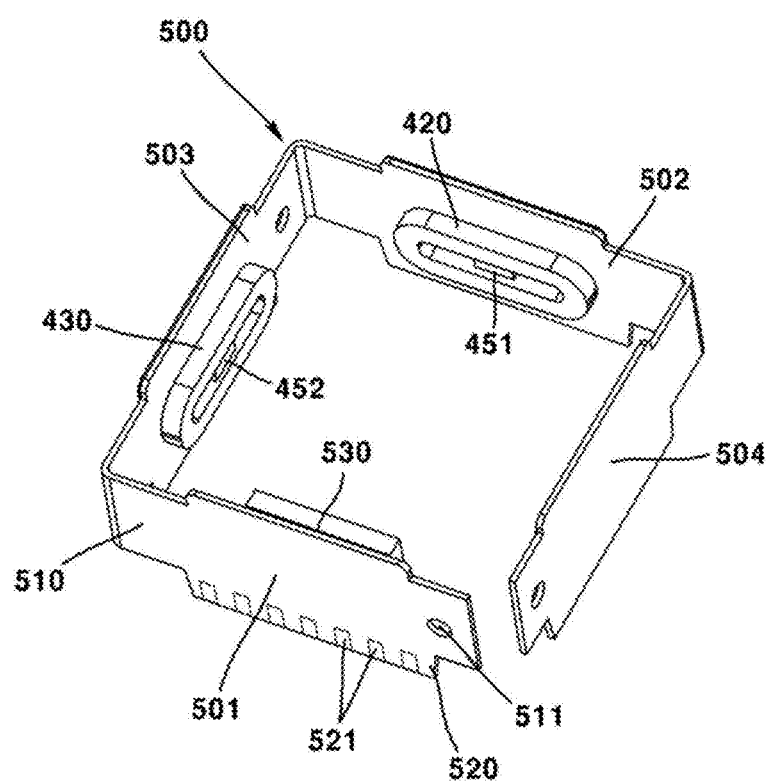
FIG. 10 is a perspective view of a substrate and a coil of a camera module according to an exemplary embodiment of the present invention.
Figure 11:
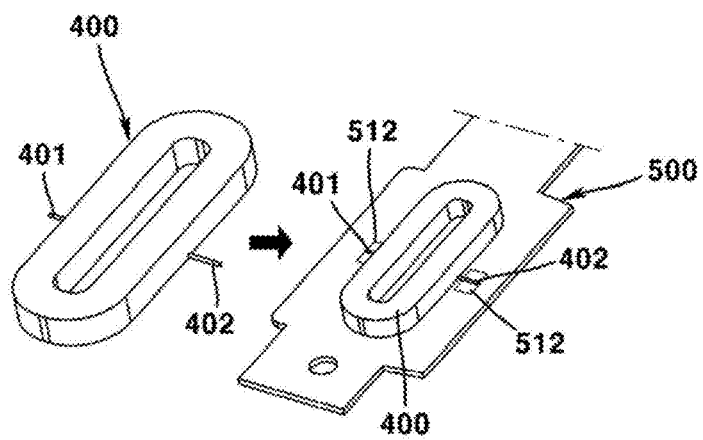
FIG. 11(a) is a schematic view illustrating a coupling between a coil and a substrate of a camera module according to an exemplary embodiment of the present invention and FIG. 11(b) is a schematic view illustrating a coupling between a coil and a substrate of a camera module according to a modification.
Figure 11:
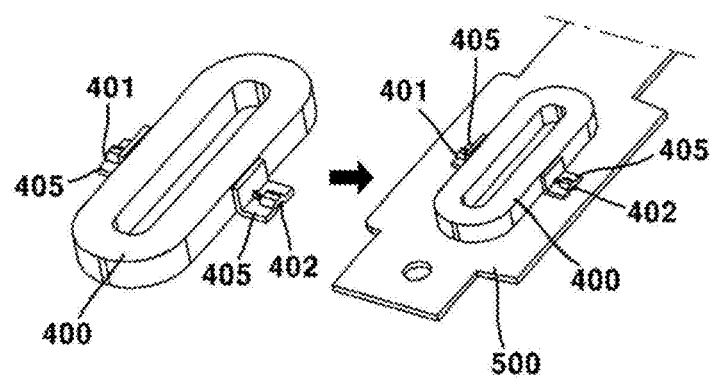
Figure 12:
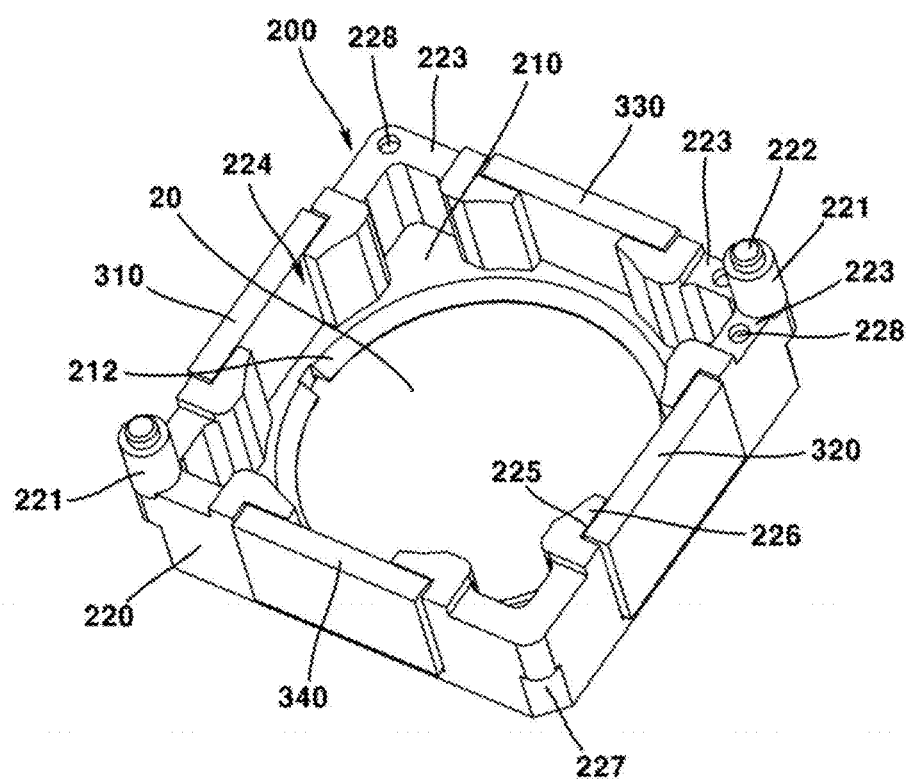
FIG. 12 is a perspective view of a holder and a magnet of a camera module according to an exemplary embodiment of the present invention.
Figure 13:
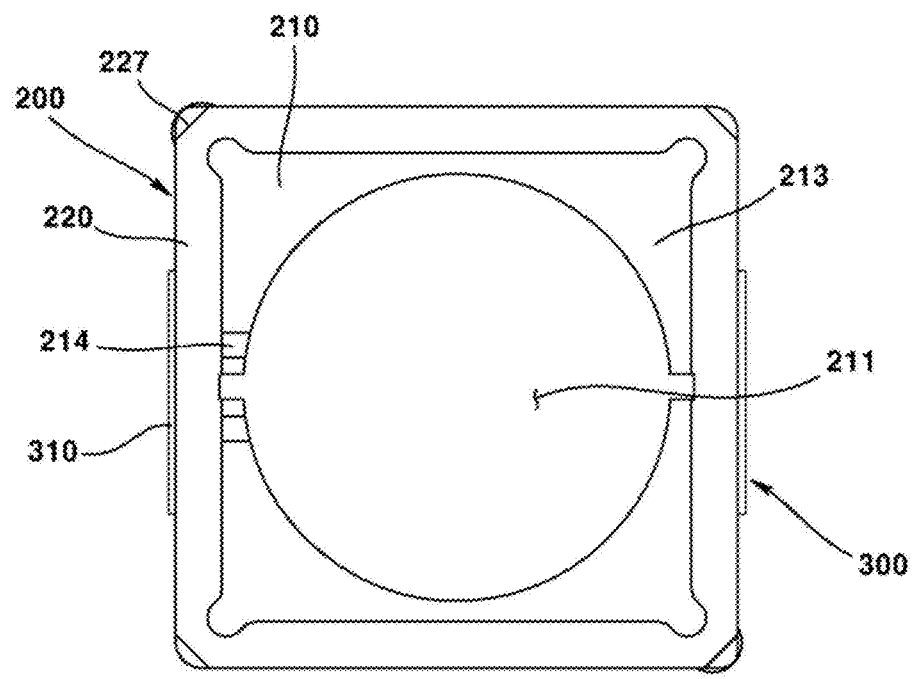
FIG. 13 is a bottom view of a holder and a magnet of FIG. 12.
Figure 14:
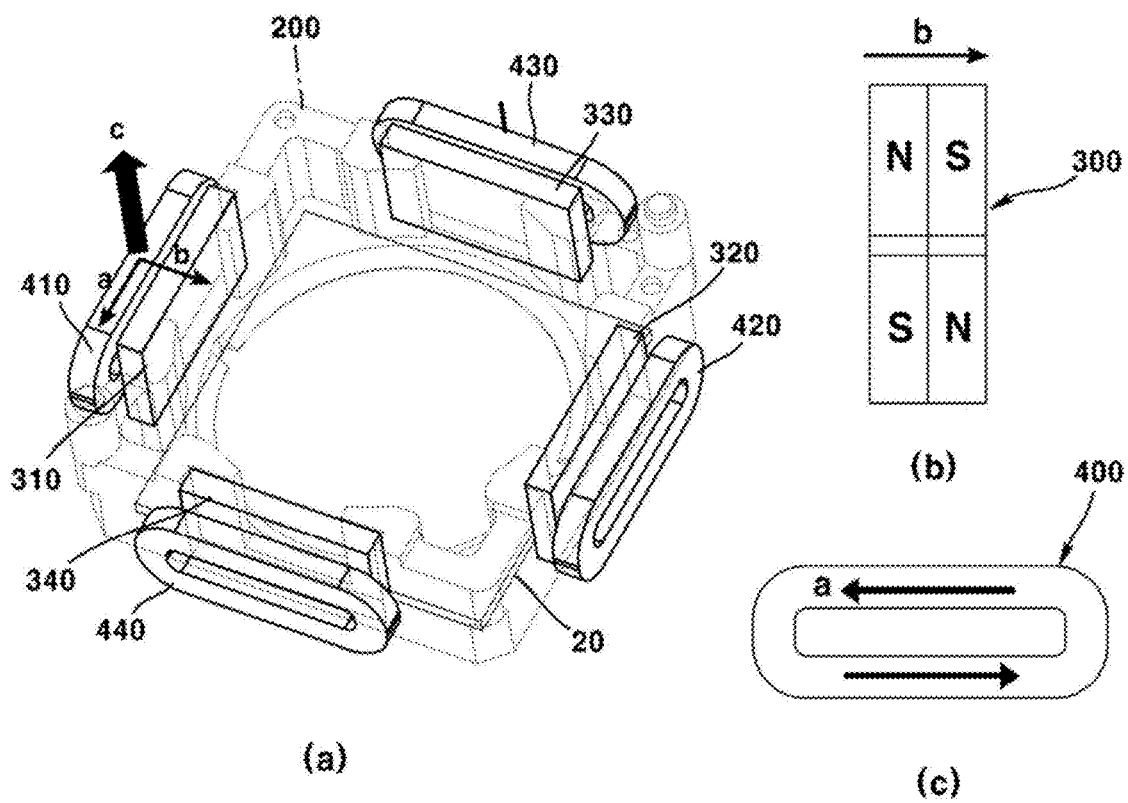
FIG. 14 is a schematic view for explaining a Lorentz force between a magnet and a coil according to an exemplary embodiment of the present invention.
Figure 15:
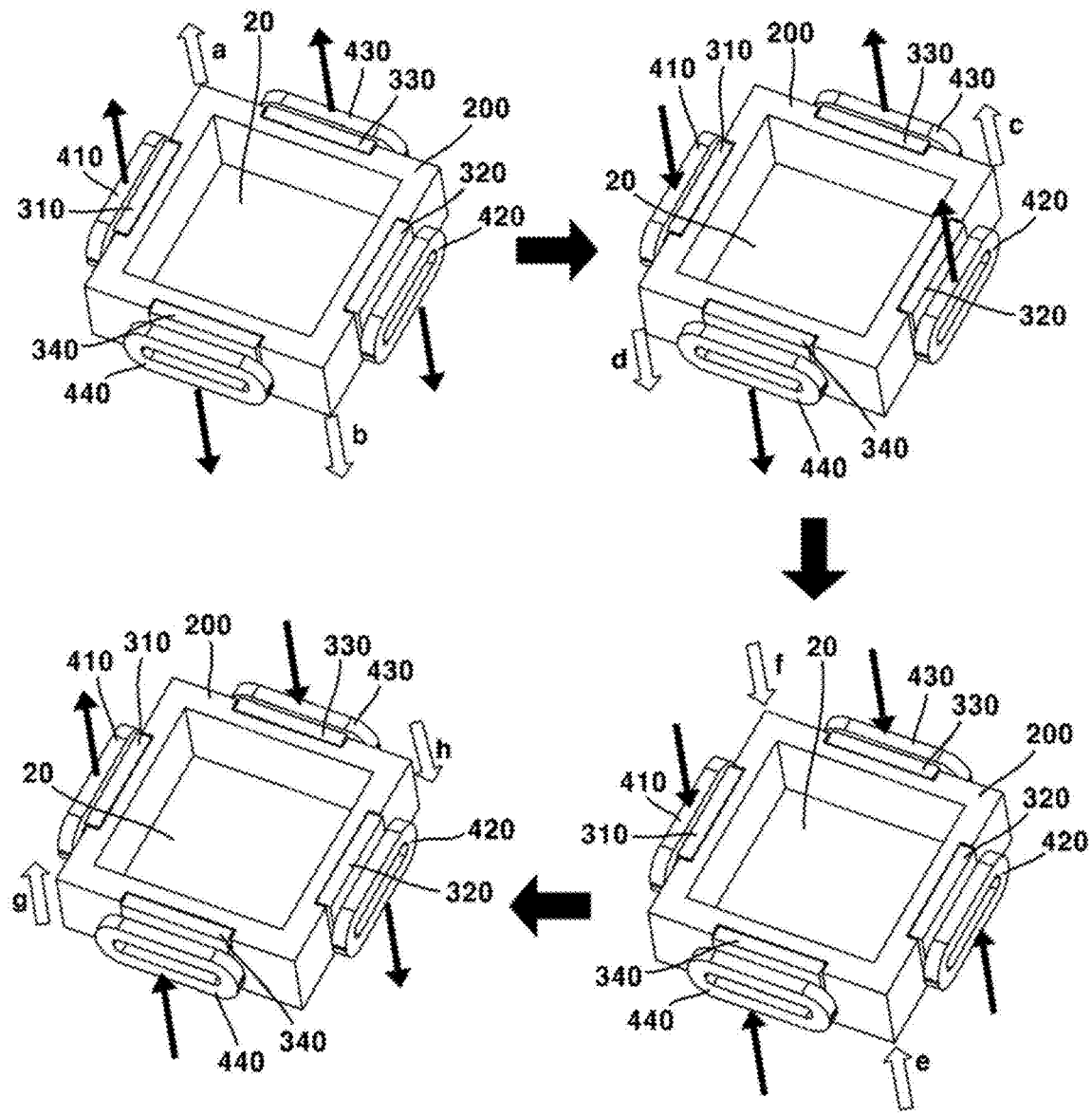
FIG. 15 is a schematic view for explaining a tilting control to a diagonal direction of a filter according to an exemplary embodiment of the present invention.
Figure 16:
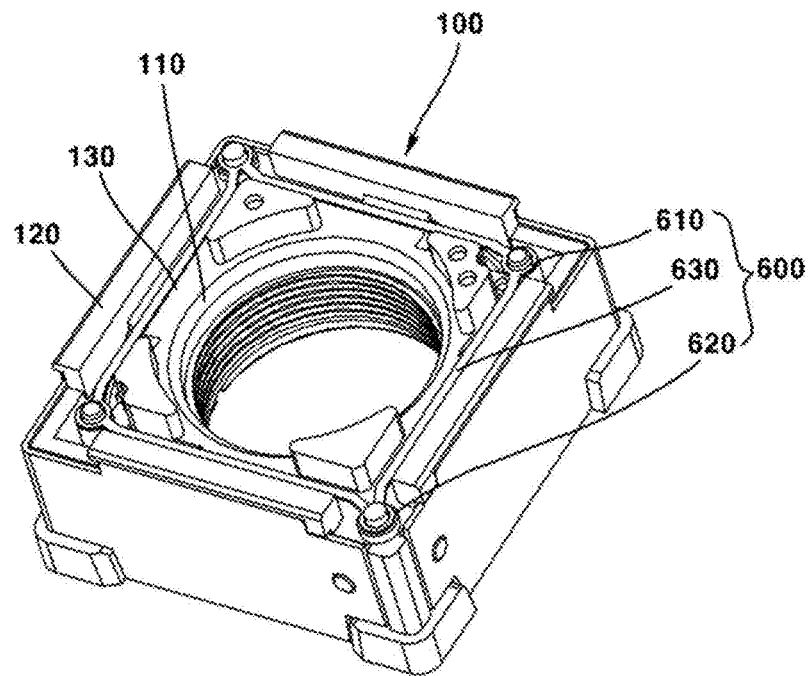
FIG. 16 is a perspective view of a partial configuration of a camera module comprising an elastic member according to an exemplary embodiment of the present invention.
Figure 17:
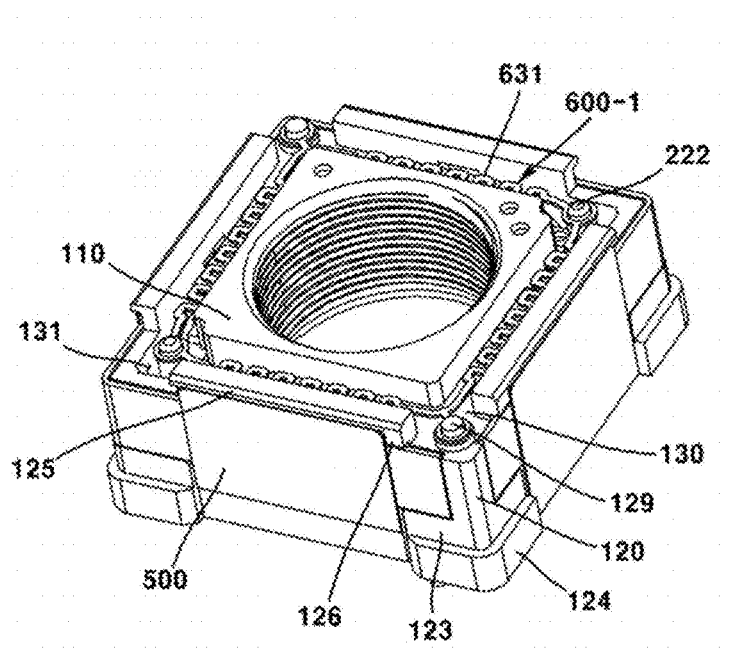
FIG. 17 is a perspective view of a partial configuration of a camera module comprising an elastic member according to a modification.
Figure 18:
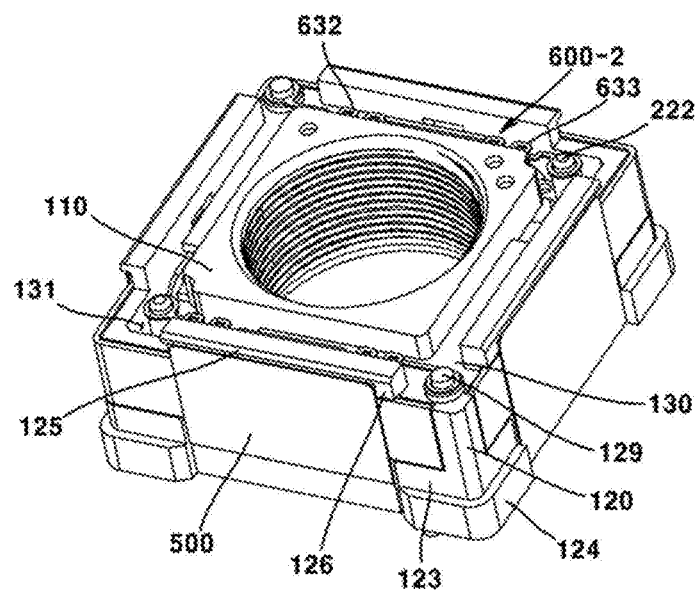
FIG. 18 is a perspective view of a partial configuration of a camera module comprising an elastic member according to another modification.
Figure 19:
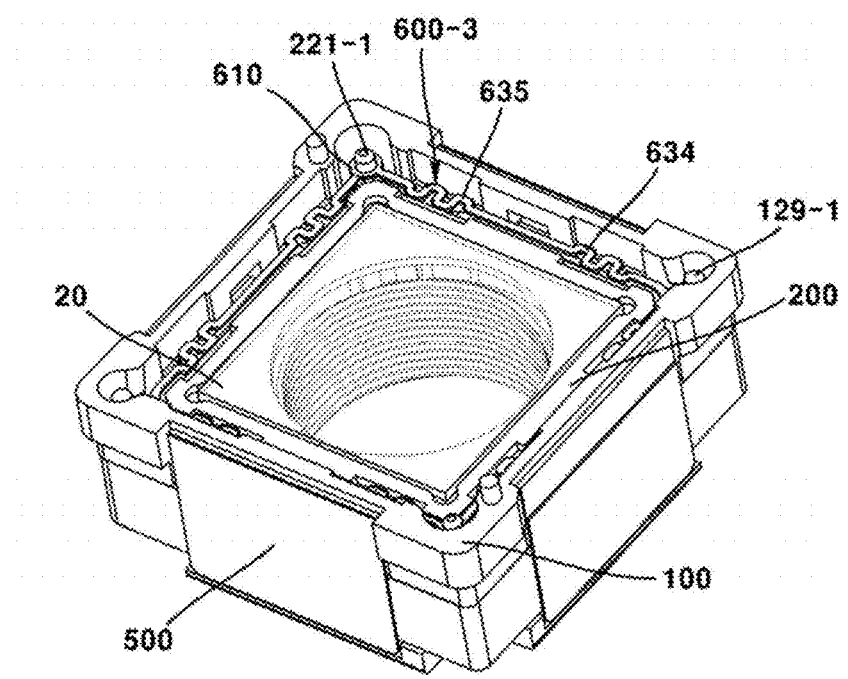
FIG. 19 is a bottom perspective view of a partial configuration of a camera module comprising an elastic member according to still another modification.
Figure 20:
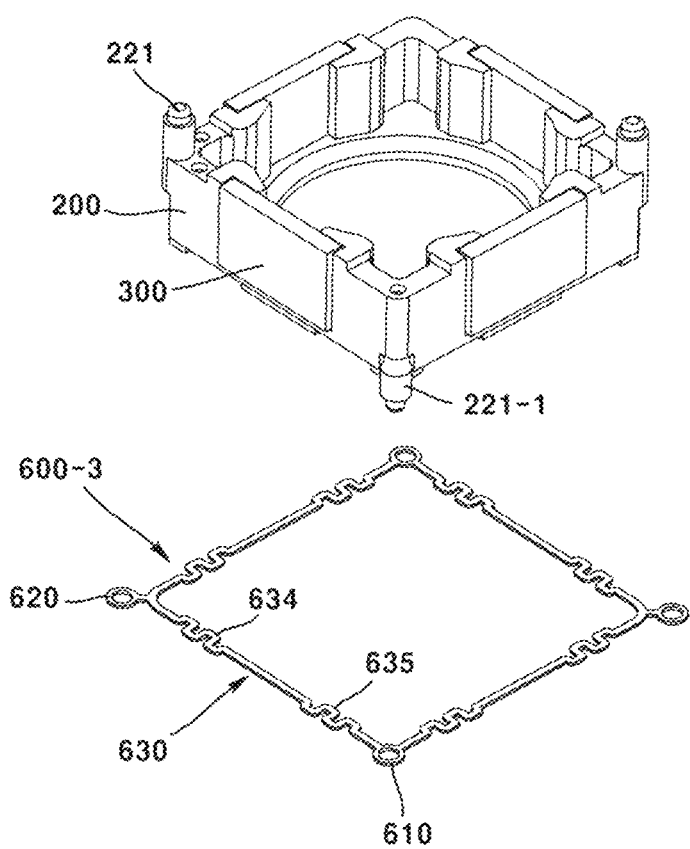
FIG. 20 is an exploded perspective view of a partial configuration of a part of a camera module of FIG. 19.
Figure 21:
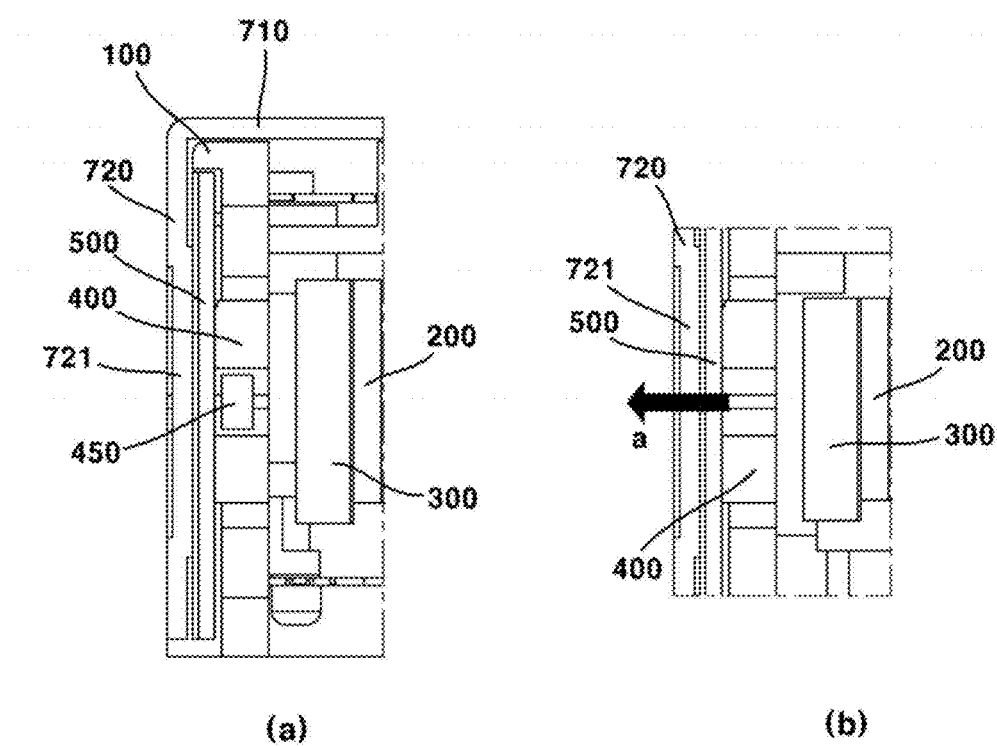
FIG. 21(a) is a cross-sectional view illustrating a coupled structure of a cover, a substrate and a coil of a camera module according to an exemplary embodiment.
FIG. 21(b) is a partially expanded view of FIG. 21(a) to illustrate a radiation flow based on conduction.
Figure 22:
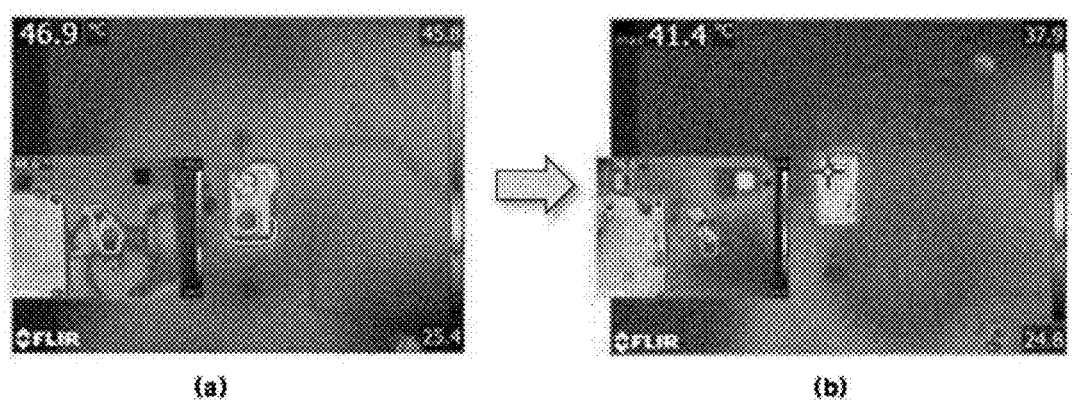
FIG. 22(a) is a temperature measurement data of a camera module according to a comparative example.
FIG. 22(b) is a temperature measurement data of a camera module according to an exemplary embodiment of the present invention.

FIG. 1 is a perspective view of a camera module according to an exemplary embodiment of the present invention, FIG. 2 is an exploded perspective view of a camera module according to an exemplary embodiment of the present invention, FIG. 3a is a cross-sectional view of a camera module taken along line A-A of FIG. 1 according to an exemplary embodiment of the present invention, FIG. 3b is a cross-sectional view of a camera module taken along line B-B of FIG. 1 according to an exemplary embodiment of the present invention, FIG. 4a is a cross-sectional view of a camera module taken along line C-C of FIG. 1 according to an exemplary embodiment of the present invention, FIG. 4b is a cross-sectional view of a camera module taken along line D-D of FIG. 1 according to an exemplary embodiment of the present invention, FIG. 5 is a perspective view of a partial configuration of a camera module according to an exemplary embodiment of the present invention, FIG. 6 is a perspective view of a partial configuration of a light receiving part of a camera module according to an exemplary embodiment of the present invention, FIG. 7 is an exploded perspective view of a partial configuration of a light receiving part of a camera module of FIG. 6 according to an exemplary embodiment of the present invention, FIG. 8 is a perspective view of a partial configuration of a camera module according to an exemplary embodiment of the present invention, FIG. 9 is a perspective view of a housing of a camera module according to an exemplary embodiment of the present invention, FIG. 10 is a perspective view of a substrate and a coil of a camera module according to an exemplary embodiment of the present invention, FIG. 11(a) is a schematic view illustrating a coupling between a coil and a substrate of a camera module according to an exemplary embodiment of the present invention and FIG. 11(b) is a schematic view illustrating a coupling between a coil and a substrate of a camera module according to a modification, FIG. 12 is a perspective view of a holder and a magnet of a camera module according to an exemplary embodiment of the present invention, FIG. 13 is a bottom view of a holder and a magnet of FIG. 12, FIG. 14 is a schematic view for explaining a Lorentz force between a magnet and a coil according to an exemplary embodiment of the present invention, FIG. 15 is a schematic view for explaining a tilting control to a diagonal direction of a filter according to an exemplary embodiment of the present invention, FIG. 16 is a perspective view of a partial configuration of a camera module comprising an elastic member according to an exemplary embodiment of the present invention, FIG. 17 is a perspective view of a partial configuration of a camera module comprising an elastic member according to a modification, FIG. 18 is a perspective view of a partial configuration of a camera module comprising an elastic member according to another modification, FIG. 19 is a bottom perspective view of a partial configuration of a camera module comprising an elastic member according to still another modification, FIG. 20 is an exploded perspective view of a partial configuration of a part of a camera module of FIG. 19, FIG. 21(a) is a cross-sectional view illustrating a coupled structure of a cover, a substrate and a coil of a camera module according to an exemplary embodiment, and FIG. 21(b) is a partially expanded view of FIG. 21(a) to illustrate a radiation flow based on conduction and FIG. 22(a) is a temperature measurement data of a camera module according to a comparative example, and FIG. 22(b) is a temperature measurement data of a camera module according to an exemplary embodiment of the present invention.

The ToF camera device may comprise a camera device. The ToF camera device may comprise a camera module.

The camera module may comprise a light emitting part (1). The light emitting part (1) may be a light emitting module, a light emitting unit, a light assembly or a light emitting device. The light emitting part (1) may generate an output light signal and irradiate the said signal to an object. At this time, the light emitting part (1) may generate the output light signal in a pulse wave form or a continuous wave form and output the signal. The continuous wave may be a sinusoid wave or a squared wave. By generating the output light signal in the pulse wave form or a continuous wave form, the ToF camera device may detect a phase difference between an output light signal outputted from the light emitting part (1) and an input light signal reflected from an object and inputted into a light receiving part (2) of the ToF camera device. In the present exemplary embodiment, the output light may mean a light outputted from the light emitting part (1) and incident on an object, and the input light may mean a light outputted from the light emitting part (1) to reach an object, reflected from the object and inputted to a ToF camera device. The output light may be an incident light, and the input light may be a reflection light from a prospect of an object.

The light emitting part (1) may irradiate the generated output light signal to an object for a predetermined integration time. Here, the integration time may mean one frame period. In case of generating a plurality of frames, the set integration time may be repeated. For example, when a ToF camera device captures an object using 20 FPS, an integration time may be ¹/₂₀ [sec]. Furthermore, in case of generating a 100-frame, an integration time may be repeated 100 times.

The light emitting part (1) may generate a plurality of output light signals, each having a different frequency. The light emitting part (1) may repeatedly and sequentially generate a plurality of output light signals each having a different frequency. Alternatively, the light emitting part (1) may simultaneously generate a plurality of output light signals each having a different frequency.

The light emitting part (1) may comprise a light source (40). The light source (40) may generate a light. The light source (40) may output a light. The light source (40) may irradiate a light. The light generated by the light source (40) may be an infrared ray whose wavelength is 770~3000 nm. Alternatively, a light generated by the light source (40) may be a visible ray whose wavelength is 380~770 nm. The light source (40) may comprise an LED (Light Emitting Diode). The light source (40) may comprise a plurality of LEDs arranged in a predetermined pattern. In addition, the light source (40) may comprise an OLED (Organic light emitting diode) or an LD (Laser diode).

The light emitting part (1) may comprise a light modulator that modulates a light. The light source (40) may generate an output light signal of pulse wave or a continuous wave by repeating ON/OFF at a predetermined time interval. Here, the predetermined time interval may be a frequency of output light signal. The ON/OFF of the light source (40) may be controlled by the light modulator. The light modulator may allow generating an output light signal of continuous wave or pulse wave by controlling ON/OFF of the light source (40). The light modulator may control the light source (40) to generate an output light signal of continuous wave or pulse wave through a frequency modulation or a pulse modulation.

The light emitting part (1) may comprise a diffuser (50). The diffuser (50) may be a diffuser lens. The diffuser (50) may be disposed at a front side of light source (40). A light outputted from the light source (40) may be incident on an object through the diffuser (50). The diffuser (50) may change a path of a light outputted from the light source (40). The diffuser (50) may concentrate lights outputted from the light source (40).

The light emitting part (1) may comprise a cover (60). The cover (60) may be so disposed as to cover the light source (40). The cover (60) may be disposed on a PCB (4, Printed Circuit Board). The cover (60) may comprise an upper plate comprising a hole, and a lateral plate extended from the upper plate.

The camera module may comprise a light receiving part (2). The light receiving part (2) may be a light receiving module, a light receiving unit, a light receiving assembly or a light receiving device. The light receiving part (2) may detect a light reflected from an object by being outputted from the light emitting part (1). The light receiving part (2) may generate an input light signal corresponding to an output light signal outputted from the light emitting part (1). The light receiving part (2) may be disposed in parallel with the light emitting part (1). The light receiving part (2) may be disposed at a side of the light emitting part (1). The light receiving part (2) may be disposed at a same direction as that of the light emitting part (1).

The light receiving part (2) may comprise a lens module (10). A light reflected from an object may pass through a lens module (10). An optical axis of the lens module (10) and an optical axis of sensor (30) may be aligned. The lens module (10) may be coupled with a housing (100). The lens module (10) may be fixed to the housing (100).

The light receiving part (2) may comprise a filter (20). The filter (20) may be coupled to a holder (200). The filter (20) may be interposed between the lens module (10) and the sensor (30). The filter (20) may be disposed on a light path between an object and a sensor (30). The filter (20) may filter a light having a predetermined wavelength scope. The filter (20) may pass a light of particular wavelength. That is, the filter (20) may reflect, cut off or absorb a light of particular wavelength. The filter (20) may pass an infrared ray and cut off a light of a wavelength other than infrared ray. Alternatively, the filter (20) may pass a visible ray but cut off a light of wavelength other than the visible ray. The filter (20) may be moved. The filter (20) may be moved integrally with a holder (200). The filter (20) may be tilted.

The filter (20) may be moved to adjust a light path. The filter (20) may change a path of light incident from a sensor (30) through the movement. The filter (20) may change an FOV (Field of View) angle of incident light or direction of FOV.

The filter (20) according to the present exemplary embodiment may enable a ToF of high resolution by changing a path of incoming light by being tilted to an inclined direction. Two adjacent coils among first to fourth coils (410, 420, 430, 440) on the filter (20) may be applied with a forward current and the remaining two coils may be applied with a reverse current to allow being tilted to a diagonal direction of the filter (20).

The filter (20) may be tilted to a diagonal direction by control of a current applied to a first coil (410) and a third coil (430). The filter (20) may be so disposed as to be tilted to a diagonal direction of the filter (20) by allowing a current to be applied to two adjacent coils out of first to fourth coils (410, 420, 430, 440). The filter (20) may comprise a first corner disposed at a position corresponding to that of a first corner portion of the holder (200). At this time, the first corner of filter (20) may be tilted upward of an optical axis by the first coil (410) and the third coil (430). The filter (20) may comprise a third corner disposed at a position corresponding to that of a third corner portion of holder (200). At this time, the third corner of filter (20) may be tilted downward of optical axis by the second coil (420) and the fourth coil (440), and the first corner of filter (20) may be further tilted upward of optical axis by the second coil (420) and the fourth coil (440).

The light receiving part (2) may comprise a sensor (30). The sensor (30) may sense a light. The sensor (30) may detect a light and output the detected light in an electric signal. The sensor (30) may detect a light of a wavelength corresponding to that of a light outputted from the light source (40). The sensor (30) may detect an infrared ray. Furthermore, the sensor (30) may detect a visible ray.

The sensor (30) may comprise a pixel array for receiving a light having passed the lens module (10) and converting the light to an electric signal corresponding to the light, a driving circuit for driving a plurality of pixels comprised in the pixel array, and a lead-out circuit for leading an analogue pixel signal of each pixel. The lead-out circuit may generate a digital pixel signal (or image signal) through analogue-digital conversion by comparing an analogue pixel signal with a reference signal. Here, the digital pixel signal of each pixel comprised in the pixel array may constitute an image signal, where the image signal may be defined as an image frame by being transmitted in a frame unit. That is, the image sensor may output a plurality of image frames.

The light receiving part (2) may comprise an image synthesizer. The image synthesizer may comprise an image processor that receives an image signal from the sensor (30), and processing the image signal (e.g., interpolation, frame synthesis). Particularly, the image synthesizer may synthesize an image signal to an image signal (high resolution) of one frame using an image signal (low resolution) of a plurality of frames. That is, the image synthesizer may synthesize a plurality of image frames comprised in the image signal received from the sensor (30) and generate the synthesized result in a synthesized image. The synthesized image generated from the image synthesizer may have a resolution higher than a plurality of image frames outputted from the sensor That is, the image synthesizer may generate an image of high resolution through an SR (Super Resolution) technique. The plurality of image frames may comprise image frames generated by being changed to mutually different light paths by the movement of filter (20).

The camera module may comprise a PCB (4, Printed Circuit Board). The PCB (4) may be disposed thereon with a light emitting part (1) and a light receiving part (2). The PCB (4) may be electrically connected with the light emitting part (1) and the light receiving part (2).

The camera module may comprise a coupling part (3). The coupling part (3) may be electrically connected to the PCB (4). The coupling part (3) may be connected to elements of optical apparatus. The coupling part (3) may comprise a connector (7) connected with the elements of optical apparatus. The coupling part (3) may comprise a substrate (5) disposed with the connector (7) and connected with a connection part (6). The substrate (5) may be a PCB.

The camera module may comprise a connection part (6). The connection part (6) may connect the PCB (4) with the coupling part (3). The connection part (6) may have flexibility. The connection part (6) may be a FPCB (Flexible PCB).

The camera module may comprise a reinforcement plate (8). The reinforcement plate (8) may comprise a stiffener. The reinforcement plate (8) may be disposed at a lower surface of PCB (4). The reinforcement plate (8) may be formed with a SUS (Stainless Use Steel).

The camera module may comprise a lens driving device. The camera module may comprise a VCM (Voice Coil Motor). The camera module may comprise a lens driving motor. The camera module may comprise a lens driving actuator. The camera module may provide a 3D tilt to the filter (20). The camera module may be a tilting actuator.

The tilting drive principle of a camera module according to the present exemplary embodiment is as follows:

A camera module may be applied with four driving parts using the Lorentz force. As shown in FIG. 15, when a 'positive (+) directional Lorentz force is generated from a first driving part comprising a first coil (410) and a first magnet (310) and a third driving part comprising a third coil (430) and a third magnet (330), and when a 'negative (−) directional Lorentz force is generated from a second driving part comprising a second coil (420) and a second magnet (320) and a fourth driving part comprising a fourth coil (440) and a fourth magnet (340), an upper left diagonal line may be tilted to an upward {see 'a' in FIG. 15} direction, and conversely, a lower right diagonal line may be tilted to a downward {see 'b' in FIG. 15} direction. Thereafter, when a 'positive (+) directional Lorentz force is generated from a second driving part comprising a second coil (420) and a second magnet (320) and a third driving part comprising a third coil (430) and a third magnet (330), and when a 'negative (−) directional Lorentz force is generated from a first driving part comprising a first coil (410) and a first magnet (310) and a fourth driving part comprising a fourth coil (440) and a fourth magnet (340), an upper right diagonal line may be tilted to an upward {see 'c' in FIG. 15} direction, and conversely, a lower left diagonal line may be tilted to a downward {see 'd' in FIG. 15} direction.

When a 'positive (+) directional Lorentz force is generated from a second driving part comprising a second coil (420) and a second magnet (320) and a fourth driving part comprising a fourth coil (440) and a fourth magnet (340), and when a 'negative (−) directional Lorentz force is generated from a first driving part comprising a first coil (410) and a first magnet (310) and a third driving part comprising a third coil (430) and a third magnet (330), a lower right diagonal line may be tilted to an upward {see 'e' in FIG. 15} direction, and conversely, an upper left diagonal line may be tilted to a downward {see 'f' in FIG. 15} direction. Thereafter, when a 'positive (+) directional Lorentz force is generated from a first driving part comprising a first coil (420) and a first magnet (310) and a fourth driving part comprising a fourth coil (440) and a fourth magnet (340), and when a 'negative (−) directional Lorentz force is generated from a second driving part comprising a second coil (420) and a second magnet (320) and a third driving part comprising a third coil (430) and a third magnet (330), a left lower diagonal line may be tilted to an upward {see 'g' in FIG. 15} direction, and conversely, an upper right diagonal line may be tilted to a downward {see 'h' in FIG. 15} direction. The hitherto used positive direction may be an upward direction and a negative direction may be a downward direction. In the present exemplary embodiments, the said tilting drive may be sequentially (left upper, upper right, lower right, lower left) conducted.

The present exemplary embodiments have an advantageous effect in that four driving parts are applied to allow the force from the driving parts to be respectively controlled for accurate control. Meantime, the tilting distance can be shortened because the tilting is realized symmetrically to upper and lower directions.

The camera module may comprise a housing (100). The housing (100) may be disposed at the PCB (4). The housing (100) may be disposed on the PCB (4). The housing (100) may be disposed on an upper surface of PCB (4). The housing (100) may accommodate a holder (200) therein. The housing (100) may be coupled by a lens module (10). The housing (100) may be a coil case in which a coil is fixed. The housing (100) may be attached by a coil (400) and a substrate (500). The housing (100) may be coupled by a barrel of the lens module (10). The housing (100) may be integrally formed with an external part (120) coupled by the coil (400), and an internal part (110) coupled by the lens module (10). The housing (100) may advantageously reduce the size and the number of parts through the abovementioned integral structure. The housing (100) may be formed with a non-magnetic material.

The housing (100) may comprise a base. The camera module in a modification may comprise a base separate from the housing (100). At this time, the holder (200) may be spaced apart from the base. The base may be spaced apart from the sensor (30).

The housing (100) may comprise a first corner corresponding to a first corner of holder (200), a second corner corresponding to a second corner of holder (200), a third corner corresponding to a third corner of holder (200) and a fourth corner corresponding to a fourth corner of holder (200).

The housing (100) may comprise an internal part (110). The internal part (110) may be coupled with the lens module (10). The internal part (110) of housing (100) may comprise a hole (111). The hole (111) may be hollow hole. The hole (111) may pass through the housing (100) to an optical axis direction. An inner circumferential surface of internal part (110) may be formed with a screw thread (112). The screw thread (112) of housing (100) may be screw-connected with a screw thread of lens module (10). An upper side of the screw thread (112) of the inner circumferential surface of housing (100) may be disposed with a curved surface. An outer circumferential surface of lens module (10) may comprise a curved surface facing and spaced apart from the curved surface of housing (100).

The internal part (110) of housing (100) may comprise a recessed part (113). The recessed part (113) may be recessed. The recessed part (113) may have a corresponding curvature as that of a protrusion (221). The recessed part (113) may be so formed as to avoid interference with the protrusion (221) of holder (200). The housing (100) may comprise, at an inside of the protrusion (221), a first surface oppositely disposed against the protrusion (221) of the holder (200). The first surface of the housing (100) may be formed with a recessed part (113) having a curvature corresponding to that of the protrusion (221). Through this structure, the first surface of housing (100) may avoid the interference with the protrusion (221) of holder (200).

The internal part (110) of housing (100) may comprise a tapered surface (114). A lower end of the internal part (110) of housing (100) may be formed with a tapered surface (114). Through this structure, the lower end of the internal part (110) of housing (100) may avoid the interference with the holder (200) when the holder (200) is moved. The tapered surface (114) of housing (100) may face and be parallel disposed with a tapered surface (212) of holder (200).

The internal part (110) of housing (100) may comprise a groove (115). The groove (115) may be disposed to let known to an assembler the directivity during the assembly process of housing (100). One or more grooves (115) may be formed at a corner of housing (100).

The housing (100) may comprise an external part (120). The external part (120) may be disposed with a coil (400). The external part (120) may be disposed outside of the internal part (110). The external part (120) and the internal part (110) may be formed with a separate member. The external part (120) of housing (100) may comprise a lateral wall. The lateral wall of housing (100) may be disposed outside of the holder (200).

The lateral wall of housing (100) may comprise first to fourth lateral walls. The housing (100) may comprise mutually oppositely disposed first and second lateral walls and mutually oppositely disposed third and fourth lateral walls between the first and second lateral walls.

The external part (120) of housing (100) may comprise a hole (121). The hole (121) of housing (100) may take a shape corresponding to that of a coil (400). The hole (121) may be so formed as to have a greater shape than that of the coil (400). The hole (121) may accommodate the coil (400). The lateral wall of housing (100) may comprise a hole (121). The hole (121) may be formed on each of the first to fourth lateral walls.

The external part (120) of housing (100) may comprise a groove (122). The groove (122) may be disposed with a distal end of coil (400). The groove (122) may comprise a first groove and a second groove. In a modification, the housing (100) may be formed with any one of the first groove and the second groove. Any one or more of the first groove and the second groove may be omitted. The lateral wall of housing (100) may comprise a first groove formed by being upwardly recessed from the hole (121) of the lateral wall of housing (100) and a second groove formed by being downwardly recessed from the hole (121) of lateral wall of housing (100).

The external part (120) of housing (100) may comprise a staircase part. The staircase part may be protrusively formed on both sides of terminal part (520) of substrate (500). The staircase part may be overlapped with the substrate (500) to an optical axis direction. The staircase part may be disposed underneath a part of the substrate (500). The staircase part may comprise a first staircase (123) and a second staircase (124). The first staircase (123) may be protrusively formed on a corner of an outside of housing (100). The first staircase (123) may take a shape corresponding to that of the substrate (500). The first staircase (123) may be disposed with a substrate (500). The second staircase (124) may be protrusively formed on an outside of first staircase (123). The second staircase (124) may take s shape corresponding to that of a lateral plate (720) of cover (700). The second staircase (124) may be disposed with a lateral plate (720) of cover (700).

The external part (120) of housing (100) may comprise a first protrusion (125). The first protrusion (125) may be so formed on a lateral wall of housing (100) as to be overlapped with the substrate (500) to an optical axis direction. The first protrusion (125) may be disposed on an extension part (530) of substrate (500). The first protrusion (125) may be correspondingly formed to and on an upper end of the substrate (500) to prevent the substrate (500) from being upwardly disengaged.

The external part (120) of housing (100) may comprise a second protrusion (126). The second protrusion (126) may be formed on a lateral wall of housing (100) to be downwardly extended from a distal end of the first protrusion (125) at a lateral wall of housing (100). The second protrusion (126) may be overlapped with an extension part (530) of substrate (500) to a disposed direction of substrate (500). The second protrusion (126) may be overlapped with the extension part (530) of substrate (500) to a direction perpendicular to an optical axis direction. The second protrusion (126) may guide the substrate (500) so that the substrate can be disposed on a designated position. The second protrusion (126) may be disposed only on a distal end of the first protrusion (125).

The external part (120) of housing (100) may comprise a lug (127). The lug (127) may be formed on an outside of the external part (120) of housing (100). The lug (127) may be inserted into a hole (511) of substrate (500). The lug (127) may comprise a plurality of lugs.

The external part (120) of housing (100) may comprise a protrusion (128). The protrusion (128) may be formed at a corner of housing (100). The protrusion (128) may be respectively formed on a first lateral wall near the corner and a second lateral wall near the corner. The protrusion (128) may be disposed with both distal ends of substrate (500).

The external part (120) of housing (100) may comprise a lug (129). The lug (129) may be coupled with a second coupling part (620) of elastic member (600). The lug (129) may be inserted into a hole of the second coupling part (620) of elastic member (600).

The housing (100) may comprise a connection part (130). The connection part (130) may connect the internal part (110) and the external part (120). At least a part of the connection part (130) may be overlapped with the holder (200) to an optical axis direction. The connection part (130) may be disposed on at least a part of the holder (200).

The connection part (130) of housing (100) may comprise a hole (131). The hole (131) of the housing (100) may be formed on a first diagonal direction and a third diagonal direction of filter (20). The hole (131) may be so formed as not to be interfered with the holder (200). At least a part of the holder (200) may pass through the hole (131) of housing (100). At this time, a part of the holder (200) having passed the hole (131) may be coupled with an elastic member (600).

The camera module may comprise a holder (200). The holder (200) may be disposed with a filter (20). The holder (200) may be integrally moved with the filter (20). The holder (200) may be connected with the elastic member (600). The holder (200) may be spaced apart from the housing (100). The holder (200) may be disposed with a magnet (300). The holder (200) may be a case in which the filter (20) and the magnet (300) are assembled. The holder (200) requires to be minimized in size (weight) because of being an actually moving part. In the present exemplary embodiment, as shown in FIG. 12, an area of attachment part (226) of magnet (300) can be minimized in order to make the size minimized. The holder (200) may be used with a non-magnetic material in order to minimize an influence of magnetic force with the magnet (300). The holder (200) may be spaced apart from a base of housing (100). The holder (200) may be tilted by being coupled with the elastic member (600) to a first diagonal direction of the filter (20).

The holder (200) may comprise a first lateral surface, a second lateral surface disposed opposite to the first lateral surface, and third and fourth lateral surfaces mutually oppositely disposed between the first and second lateral surfaces. The holder (200) may comprise a first corner between the first lateral surface and the third lateral surface, a second corner between the second lateral surface and the third lateral surface, a third corner between the second lateral surface and the fourth lateral surface and a fourth corner between the fourth lateral surface and the first lateral surface. The holder (200) may comprise a first corner portion between the first lateral surface and the third lateral surface, a second corner portion between the second lateral surface and the third lateral surface, a third corner portion between the second lateral surface and the fourth lateral surface and a fourth corner portion between the fourth lateral surface and the first lateral surface.

The holder (200) may comprise a lower plate part (210). The lower plate part (210) may be coupled by the filter (20). A lower surface of the lower plate part (210) may be coupled by the filter (20) to a lower surface using an adhesive. The lower plate part (210) of holder (200) may comprise a hole (211). The hole (211) may be a hollowed hole. The hole (211) may pass through the lower plate part (210) of holder (200) to an optical axis direction.

The lower plate part (210) of holder (200) may comprise a groove (213). The groove (213) may be disposed with the filter (20). The groove (213) may be formed to take a shape corresponding to that of filter (20). The groove (213) may be accommodated by at least a part of the filter (20).

The lower plate part (210) of holder (200) may comprise a vent groove (214). The vent groove (214) may be formed on the groove (213) of the lower plate part (210). Through this structure, the vent groove (214) may function as a path through which an adhesive attaching the filter (20) and the holder (200) or a gas generated in the course of an adhesive disposed on other areas inside the camera module being cured can escape.

The lower plate part (210) of holder (200) may comprise a tapered surface (212). The tapered surface (212) may be so formed on an area of the holder (200) as to avoid interference with the housing (100) when the holder (200) is moved.

The holder (200) may comprise a lateral wall (220). The lateral wall (220) may be extended upward of the lower plate part (210). The lateral wall (220) may be fixed by a magnet (300). The lateral wall (220) of holder (200) may comprise a protrusion (221). The protrusion (221) of holder (200) may be disposed on an upper surface of holder (200). The protrusion (221) may pass through a hole (131) of housing (100). The protrusion (221) may be disposed on the hole (131) of housing (100). The protrusion (221) may be coupled with a first coupling part (610) of elastic member (600).

The lateral wall (220) of holder (200) may comprise a lug (222). The lug (222) may be formed at an upper surface of the protrusion (221). The lug (222) may be coupled with a first coupling part (610) of elastic member (600). The lug (222) may be inserted into a hole of the first coupling part (610) of elastic member (600).

The lateral wall (220) of holder (200) may comprise a groove (223). The groove (223) may be formed at an upper surface of holder (200) about the protrusion (221). Through this structure, an interference with the housing (100) can be avoided when the holder (200) is moved. A corner of the holder (200) may be formed with the protrusion (221) coupled with the elastic member (600), and a groove (223) may be additionally formed in order to avoid the interference with the housing (100) about the protrusion (221). The groove (223) may be formed at a side of the protrusion (221). The groove (223) may be formed at both sides of protrusion (221). The groove (223) may be formed at an upper surface of lateral wall (220) of holder (200). The groove (223) may be a recess.

The lateral wall (220) of holder (200) may comprise a hole (224). The hole (224) may be formed at a center of an attachment part (226). That is, the attachment part (226) may be so disposed as to be spaced apart. Through this configuration, the size of camera module to a horizontal direction may be reduced. That is, a space may be obtained through the hole (224) formed at the center of the attachment part (226) to allow preventing interference with the housing (100) and minimizing the size of holder (200) to a horizontal direction.

The lateral wall (220) of holder (200) may comprise a staircase (225). The staircase (225) may support an inner surface of magnet (300). A staircase surface of staircase (225) may be disposed with an inner surface of magnet (300). The lateral wall (220) of holder (200) may comprise an attachment part (226). The attachment part (226) may comprise a staircase (225). The attachment part (226) may be attached by the magnet (300) using an adhesive. The attachment part (226) may fix the magnet (300).

The lateral wall (220) of holder (200) may comprise a groove (227). The groove (227) may be formed at a lower end of an outside of a corner at the lateral wall (220) of the holder (200). The groove (227) may be so formed as to prevent the interference at a lower end of the corner at the lateral wall (220) of holder (200) with the housing (100) while the holder (200) is tilted to a diagonal direction.

The lateral wall (220) of holder (200) may comprise a groove (228). The groove (228) may be formed on a groove (223) formed about the protrusion (221). At this time, the groove (223) may be defined as a first groove or a recess, and the groove (228) may be defined as a second groove. The groove (228) may be so formed as to notify directivity to an assembler during the assembly process of holder (200). One or more grooves (228) may be formed at a corner of holder (200).

The camera module may comprise a magnet (300). The magnet (300) may be disposed on the holder (200). The magnet (300) may be disposed on an outer circumferential surface of holder (200). The magnet (300) may be more protruded than an outer surface of holder (200). The magnet (300) may face a coil (400). The magnet (300) may electromagnetically interact with the coil (400). The magnet (300) may be disposed on the lateral wall (220) of holder (200). At this time, the magnet (300) may be a flat plated magnet having a shape of a flat plate. In a modification, the magnet (300) may be disposed on a corner portion between lateral walls (220) of holder (200). At this time, the magnet (300) may be a corner magnet with a cubic shape having a broader outer lateral surface than an inner lateral surface.

In the present exemplary embodiment, the filter (20) can be tilted by the magnet (300) and Lorentz force applied to the coil (400) on which a current flows. In order to generate the Lorentz force, an actuator may be largely divided to a magnet part and a coil part. An actually operating area when the Lorentz force is generated may be the magnet (300). However, in a modification, the coil (400) may be moved by the Lorentz force. For vertical driving, the magnet (300) may be magnetized on both poles as shown in FIG. 14(b). That is, the magnet (300) may take a shape where two magnets having both poles are stacked.

The magnet (300) may comprise a plurality of magnets. The magnet (300) may comprise four magnets. The magnet (300) may comprise first to fourth magnets (310, 320, 330, 340). The magnet (300) may comprise a first magnet (310), a second magnet (320) disposed opposite to the first magnet (310), a third magnet (330) and a fourth magnet (340) disposed opposite to the third magnet (330). The first magnet (310) may be disposed on a first lateral surface of holder (200), the second magnet (320) may be disposed on a second lateral surface of holder (200), the third magnet (330) may be disposed on a third lateral surface of holder (200), and the fourth magnet (340) may be disposed on a fourth lateral surface of holder (200).

The camera module may comprise a coil (400). The coil (400) may face the magnet (300). The coil (400) may be so disposed as to face the magnet (300). The coil (400) may electromagnetically interact with the magnet (300). In this case, when a current is supplied to the coil (400) to form an electromagnetic field about the coil (400), the magnet (300) may be moved to the coil (400) by the electromagnetic interaction between the coil (400) and the magnet (300). The coil (400) may be coupled to an inner surface of substrate (500). The coil (400) may be disposed on a hole (121) at a lateral wall of housing (100). The coil (400) and the magnet (300) may be disposed on a mutually opposite position.

The coil (400) may comprise a pair of terminals (lead cables) for power supply. At this time, a first distal end (401) of coil (400) may be extracted upward of coil (400), and a second distal end (402) of coil (400) may be extracted downward of coil (400). The coil (400) may comprise a first distal end (401) and a second distal end (402) coupled with the substrate (500).

As illustrated in FIG. 11(a), the first and second distal ends (401, 402) of coil (400) may be coupled to a terminal (512) of substrate (500). At this time, the first and second distal ends (401, 402) of coil (400) may be coupled to a terminal (512) of substrate (500) by using soldering or Ag epoxy. That is, the coil (400) may be coupled to the substrate (500) by a manual soldering method. Meantime, as a modification illustrated in FIG. 11(b), the first and second distal ends (401, 402) of coil (400) may be coupled to a terminal (512) of substrate (500) using a separate coupling member (405). The coupling member (405) may be a coil support. The coil (400) may be surface-mounted to the substrate (500) by application of the coupling member (4050). In this case, there is an advantage of convenience in assembly through operability of manual soldering method and reduction in operation time. There is another advantage of reduced assembly tolerance in twisted position of coil (400) over manual soldering method. Through these advantages, a twisted center between the coil (400) and the magnet (300) can be prevented. The first distal end (401) of coil (400) may be disposed on a first groove of housing (100) and the second distal end (402) of coil (400) may be disposed on a second groove of housing (100). At this time, the electrically conductive materials and/or coupling member (405) connected to the first and second distal ends may be also disposed on a groove (122) of housing (100).

As shown in FIG. 14(*c*), a current generating a Lorentz force may flow in the coil (400) to one direction (See FIG. (c)'a'). A current may flow to a forward direction on the coil (400). Meantime, a current flowing to the other direction opposite to the said one direction may flow in the coil (400). That is, a current of backward direction may flow in the coil (400). As shown in FIG. 14, an N pole is arranged on an upper outside area of magnet (300) and a current is made to flow to one direction to allow generating an upward driving in response to the Lorentz force (See FIG. 14(*a*) 'c').

The coil (400) may comprise a plurality of coils. The coil (400) may comprise four coils. The coil (400) may comprise first to fourth coils (410, 420, 430, 440). Each of the first to fourth coils (410, 420, 430, 440) may be applied with an independent current. The first to fourth coils (410, 420, 430, 440) may be respectively applied with an individual current. The first to fourth coils (410, 420, 430, 440) may be electrically separated. The coil (400) may comprise a first coil (410) facing the first magnet (310), a second coil (420) facing the second magnet (320), a third coil (430) facing the third magnet (330), and a fourth coil (440) facing the fourth magnet (340). The first to fourth coils (410, 420, 430, 440) may be coupled to the housing (100). The coil (400) may comprise a first coil (410) disposed on a hole (121) of first lateral wall of housing (100), a second coil (420) disposed on a hole (121) of second lateral wall of housing (100), a third coil (430) disposed on a hole (121) of third lateral wall of housing (100), and a fourth coil (440) disposed on a hole (121) of fourth lateral wall of housing (100).

The four coils in the present exemplary embodiment may be controlled by two channels. The first coil (410) and the second coil (420) may be electrically connected. However, a direction of Lorentz force generated between the first coil (410) and the first magnet (310) and a direction of Lorentz force generated between the second coil (420) and the second magnet (320) may be mutually opposite. For example, the first coil (410) and the second coil (420) may be so arranged as to allow a mutually oppositely-directed current to flow. Alternatively, the first coil (410) and the second coil (420) may be so arranged as to be wound in mutually opposite direction. Alternatively, the first coil (410) and the second coil (420) may be so arranged as to be wound in mutually same direction while a pole arrangement of first magnet (310) and a pole arrangement of second magnet (320) may be so arranged as to be in a mutually opposite direction. Meantime, the first coil (410) and the second coil (420) may be electrically separated but integrally controlled by a controller.

The third coil (430) and the fourth coil (440) may be electrically connected. However, a direction of Lorentz force generated between the third coil (430) and the third magnet (330) and a direction of Lorentz force generated between the fourth coil (440) and the fourth magnet (340) may be mutually opposite. The third coil (430) and the fourth coil (440) may be so arranged as to allow a mutually oppositely-directed current to flow. Alternatively, the third coil (430) and the fourth coil (440) may be so arranged as to be wound in mutually opposite direction. Alternatively, the third coil (430) and the fourth coil (440) may be so arranged as to be wound in mutually same direction while a pole arrangement of third magnet (330) and a pole arrangement of fourth magnet (340) may be so arranged as to be in a mutually opposite direction. Meantime, the third coil (430) and the fourth coil (440) may be electrically separated but integrally controlled by a controller.

The camera module may comprise a sensor (450). The sensor (450) may be used for feedback control. The sensor (450) may comprise a Hall sensor or a Hall IC. The sensor (450) may detect a magnet (300). The sensor (450) may detect a magnetic force of magnet (300). The sensor (450) may be disposed among the coils (400). The sensor (450) may be disposed at an inner surface of substrate (500).

The sensor (450) may comprise a plurality of sensors. The sensor (450) may comprise two sensors. The sensor (450) may comprise a first sensor and a second sensor (451, 452). The first sensor (451) and the second sensor (452) may be so disposed as to allow a facing direction to be perpendicular. Through this structure, the first sensor (451) and the second sensor (452) can detect both an x axis direction movement and a y axis direction movement (horizontal movement) of magnet (300). In the present exemplary embodiment, an additional sensor may be further comprised to detect a z axis direction movement (vertical direction, optical axis direction) of magnet (300).

The camera module may comprise a substrate (500). The substrate (500) may be an FPCB. The substrate (500) may be disposed on the housing (100). The substrate (500) may be disposed on an outside of a lateral wall of housing (100). The substrate (500) may be interposed between a lateral plate (720) of cover (700) and a lateral wall of housing (100). The substrate (500) may be press-fitted into a first staircase (123) of housing (100), a first protrusion (125), a second protrusion (126), a lug (127) and a protrusion (128). The substrate (500) may be so disposed as to wrap an outside of four lateral walls of housing (100). In the present exemplary embodiment, a position control guide may be interposed between the substrate (500) and the housing (100) to prevent a position twist of coils (400).

The substrate (500) may be connected to a PCB (4), which is a main board, in order to provide a signal to the coils (400) when the coils (400) are assembled. The substrate (500) may be fixed to the housing (100), which is a coil case, to allow the coils (400) to be stably fixed to the substrate (500). The substrate (500) may be also coupled by a sensor (450) to sense the position of the magnet (300). The substrate (500) may be an FPCB. The substrate (500) may be mounted with a sensor (450) and a coil (400) using an SMT. In the present exemplary embodiment, the substrate is coupled by the sensor (500) to structurally dispense with separate parts for electrically conducting with the sensor (450). In the present exemplary embodiment, a space for connection may be minimized by soldering the terminal part (520) of substrate (500) and the PCB (4) while the substrate (500) is made to be disposed at an outside of housing (100).

The substrate (500) may comprise first to fourth parts (501, 502, 503, 504). The substrate (500) may comprise a first part (501) disposed on a first lateral wall of housing (100), a second part (502) disposed on a second lateral wall of housing (100), a third part (503) disposed on a third lateral wall of housing (100), and a fourth part (504) disposed on a fourth lateral wall of housing (100). The third part (503) of substrate (500) may connect the first part (501) and the second part (502) of substrate (500), and the second part (502) of substrate (500) may connect the third part (503) and the fourth part (504) of substrate (500), and the first part (501) of substrate (500) and the fourth part (504) may be spaced apart. A distal end of first part (501) of substrate (500) and a distal end of fourth part (504) of substrate (500) may be disposed on a protrusion (128) protrusively formed at a corner where the first lateral wall and the fourth lateral wall of housing (100) meet.

The substrate (500) may comprise a body part (510). The body part (510) may be coupled by a coil (400). The body part (510) may be coupled by a sensor (450). The body part (510) may be disposed at an outside of housing (100). The body part (510) of substrate (500) may comprise a hole (711). The hole (711) may be coupled with a lug (127) of housing (100).

The substrate (500) may comprise a terminal part (520). The terminal part (520) may be downwardly extended from the body part (510) and may comprise a plurality of terminals. The terminal part (520) may be coupled with the PCB (4) by way of soldering. The terminal part (520) may be formed at a lower end of substrate (500). The terminal part (520) may be disposed among the terminal parts of housing (100).

The substrate (500) may comprise an extension part (530). The extension part (530) may be upwardly extended from the body part (510). The extension part (530) may form an upper end of substrate (500). The extension part (530) may be formed with a shape and a size corresponding to those of the first protrusion (125) and the second protrusion (126) of housing (100).

In a modification, the substrate (500) may be omitted with the extension part (530) and instead may be disposed with a first protrusion (125) above the body part (510).

The camera module may comprise an elastic member (600). The elastic member (600) may be connected to the housing (100). The elastic member (600) may connect the holder (200) and the housing (100). The elastic member (600) may possess elasticity. The elastic member (600) may comprise an element having elasticity. The elastic member (600) may comprise a leaf spring. The elastic member (600) may be formed with a metal material.

The elastic member (600) may connect a magnet part comprising a housing (100) and a magnet (300) to a coil part comprising a holder (200) and a coil (400). The elastic member (600) may function to control the driving of coil part. As illustrated in FIGS. 16, 17 and 18, the elastic member (600) may be bonded and fixed after being assembled to a lug (129) of housing (100) and a lug (222) of protrusion (221) at the holder (200). In the present exemplary embodiment, because the elastic member (600) has an assembly part and fixing part at an outside thereof, the elastic member may have a relatively easy assembly structure. In the present exemplary embodiment, the elastic member (600) may have a structure with a spring position having an upper/lower freedom. Depending on each exemplary embodiment, the elastic member (600) may be disposed only at an upper side, disposed both at upper/lower sides and disposed only at a lower side.

The elastic member (600) may comprise a first coupling part (610). The first coupling part (610) of elastic member (610) may be coupled to corner of holder (200). The first coupling part (610) of elastic member (600) may comprise two pieces of first coupling part. The said two pieces of first coupling part may be symmetrically disposed on a first diagonal direction of filter (20) to an optical axis. The two pieces of first coupling part may be mutually oppositely disposed relative to an optical axis. The first coupling part (610) of elastic member (600) may be respectively coupled to a first corner of holder (200) and to a third corner of holder (200).

The elastic member (600) may comprise a second coupling part (620). The second coupling part (620) of elastic member (600) may be coupled to a corner of housing (100) corresponding to another corner of holder (200) adjacent to a corner of holder coupled by the first coupling part (610).

The second coupling part (620) of elastic member (600) may comprise two pieces of second coupling part. The said two pieces of second coupling part may be symmetrically disposed on a second diagonal direction different from the first diagonal direction of filter (20) on an optical axis. Two pieces of second coupling part may be mutually oppositely disposed relative to an optical axis. The second coupling part (620) of elastic member (600) may be respectively coupled to a second corner of housing (100) and to a fourth corner of housing (100).

The elastic member (600) may comprise a connection part (630). The connection part (630) may connect a first coupling part (610) and a second coupling part (620). The connection part (630) may elastically connect the first coupling part (610) and the second coupling part (620). The connection part (630) may have elasticity. The connection part (630) may comprise a bent part.

The elastic member (600) may be an upper elastic member coupled to an upper surface of housing (100) to an upper surface of holder (200). At this time, the upper elastic member may be called as 'first elastic member' or a 'second elastic member'. The upper elastic member may comprise a first coupling part (610) coupled to an upper surface of holder (200), a second coupling part (620) coupled to an upper surface of housing (100), and a connection part (630) connecting the first coupling part (610) and the second coupling part (620).

The elastic member (600) may be formed with various shapes in order to find an optimum shape and stiffness. In the present exemplary embodiment, the connection part (630) of elastic member (600) may be formed with a straight shape as shown in FIG. 16. However, the connection part (630) may be roundly formed at an area where the first coupling part (610) and the second coupling part (620) meet.

The connection part (630) of elastic member (600-1), in a modification as illustrated in FIG. 17, may comprise a plurality of bent parts (631). However, the bent part (631) may not be formed by being bent, but may be an area formed in a zigzagged shape. The connection part (630) of elastic member (600-1) may comprise a bending part or a round part. In a modification, the plurality of bent parts (631) may be continuously formed to a lengthwise direction of connection part (630).

The connection part (630) of elastic member (600-2), in another modification, as shown in FIG. 18, may comprise a first bent part (632) and a second bent part (633). Unlike the bent part (631) being continuously formed in the previous modification, the first bent part (632) and the second bent part (633) may not be continuously formed.

In still another modification, as illustrated in FIG. 19, the camera module may comprise a lower elastic member (600-3). The lower elastic member (600-3) may be called as a 'first elastic member' or a 'second elastic member'. The lower elastic member (600-3) may be coupled to a lower surface of housing (100) and to a lower surface of holder (200). The lower elastic member (600-3) may comprise a first coupling part (610) coupled to a lower surface of holder (200), a second coupling part (620) coupled to a lower surface of housing (100), and a connection part (630) connecting the first coupling part (610) and the second coupling part (620). The connection part (630) of the lower elastic member (600-3) may comprise a first bent part (634) and a second bent part (635). At this time, the first bent part (634) and the second bent part (635) may be so formed as not to continuously formed, as shown in FIG. 19. However, as a modification, the connection part (630) of lower elastic member (600-3) may comprise a continuous bent part as the elastic member (600-1) of FIG. 17. Alternatively, in another modification, the connection part (630) of lower elastic member (600-3) may be straightly formed without any bent part as in the elastic member (600) of FIG. 16.

The first coupling part (610) of the lower elastic member (600-3) may be coupled to another corner {another corner different from the corner coupled by the first coupling part (610) of upper elastic member} of holder (200). The first coupling part (610) of the lower elastic member (600-3) may be coupled to a first protrusion (221-1) disposed at a first corner of holder (200), and the second coupling part (620) may be coupled to a second lug (129-1) disposed at a second corner of housing (100).

The upper elastic member in the present exemplary embodiment may be coupled to the housing (100) on a first diagonal direction of filter and may be coupled with the holder (200) on a second diagonal direction. At this time, the lower elastic member (600-3) may be coupled to the housing (100) on a second diagonal direction of filter (20), and may be coupled to the holder (200) on a first diagonal direction of filter (20). That is, a diagonal direction connecting an area coupled by the upper elastic member and a diagonal direction connecting an area coupled by the lower elastic member may be different. Through this configuration, tilt at an initial state of holder (200) can be prevented and the control of four diagonal directions can be controlled by a same current.

Meantime, the shapes of substrates (500) illustrated in FIGS. 17, 18, and 19 may be different compared with those of substrate (500) in the present exemplary embodiment.

The camera module may comprise a cover (700). The cover (700) may be a bracket. The cover (700) may comprise a 'cover can'. The cover (700) may be so disposed as to encompass the housing (100). The cover (700) may be coupled to the housing (100). The cover (700) may encompass the housing (100) thereinside. The cover (700) may form an external look of camera module. The cover (700) may take a bottom-opened cubic shape. The cover (700) may be formed with a non-magnetic material. The cover (700) may be formed with a metal material. The cover (700) may be formed with a metal plate. The cover (700) may be connected to a ground part of PCB (4). Through this structure, the cover (700) may be grounded. The cover (700) may cut off an EMI (electro-magnetic interference). At this time, the cover (700) may be called as an 'EMI shield can'. The cover (700) may protect the product against an outside shock because of an element being finally assembled. The cover (700) may be formed with a material having a thin thickness but having a high stiffness.

The cover (700) may comprise an upper plate (710) and a lateral plate (720). The cover (700) may comprise an upper plate (710) comprising a hole (711), and a lateral plate (720) downwardly extended from an outer periphery or an edge of upper plate (710). A lower end of the lateral plate (720) of cover (700) may be disposed with a second staircase (124) of housing (100). An inner surface of lateral plate (720) of cover (700) may be fixed to the housing (100) by an adhesive. An upper plate (710) of cover (700) may comprise a hole (711) corresponding to a hole (211) of holder (200).

The cover (700) functions to support the substrate (500) and the coil (400) lest the substrate (500) and the coil (400) be pushed by the Lorentz force. The cover (700) may function to radiate the heat generated from the coil (400) through conduction. The lateral plate (720) of cover (700) may comprise a bent part (721) for being contacted to an outside of substrate (500) by allowing a part of the lateral plate (720) of cover (700) to be inwardly bent. The bent part (721) may comprise any one or more of a recessed part, a press-fit part and a received part. In the present exemplary embodiment, the heat generated from the coil (400) can be radiated to an outside through conduction according to a contact structure of substrate (500) of the bent part (721) which is a radiation optimized structure, by allowing the coil (400), the substrate (500) and metal-materialed cover (700) to be connected (See FIG. 17(b) 'a'). When compared with the comparative example of FIG. 18(a), it can be confirmed that an inner temperature of camera module of FIG. 18(b) according to the present invention has become reduced. Inter alia, the temperature of an area measured at 46.9° C. in the comparative example is measured at 41.4° C. in the present exemplary embodiment, which shows that the temperature improvement effect has been accomplished by about 10% in the present invention.

The lateral plate (720) of cover (700) may comprise a plurality of lateral plates. The plurality of lateral plates may comprise first to fourth lateral plates. The lateral plate (720) of cover (700) may comprise first and second lateral plates, each disposed on an opposite side, and third and fourth lateral plates each facing the other between the first and second lateral plates.

The stiffness of elastic member (600) in the present invention may be 53 mN/mm to 80 mN/mm. At this time, the stiffness of elastic member (600) may be the stiffness of connection part (630) of elastic member (600). When the stiffness of elastic member (600) is less than 53 mN/mm, a greater problem can be generated than a target tilting angle even if a current level is made lower when referred to a measurement value at the analysis stage, and 80 mN/mm may be a largest value on a limited space of the present exemplary embodiment. Furthermore, the given description may be applicable to the elastic member (600-1, 600-2) of modification of the present exemplary embodiment to the lower elastic member (600-3).

The level of current applied to the coil (400) in the present exemplary embodiment may be 18 mA to 22 mA. When a current applied to a coil (400) is less than 18 mA, and when the stiffness of elastic member (600) at the analysis stage test is 53 mN/mm, there is generated a small tilting angle, and when the stiffness exceeds 22 mA, a current consumption is increased to disadvantageously generate a heat from the coil.

Now, a method of obtaining a high resolution image will be described with reference to the accompanying drawings through an SR (Super Resolution) technique in a camera module according to the present invention.

Figure 23:
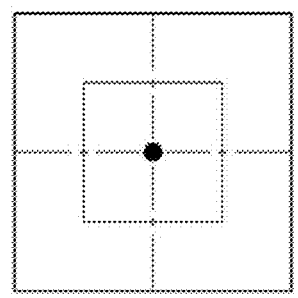
FIG. 23 is a conceptual view sequentially and conceptually illustrating a plurality of images acquired for an SR (Super Resolution) technique in a camera module according to an exemplary embodiment of the present invention.
Figure 23:
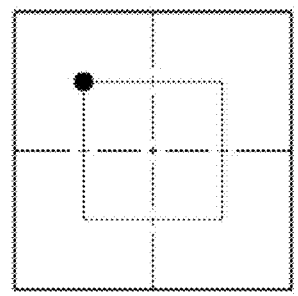
Figure 23:
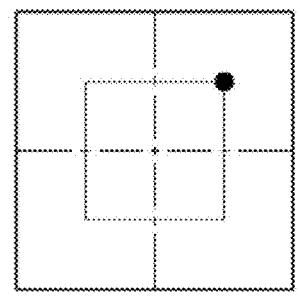
Figure 23:
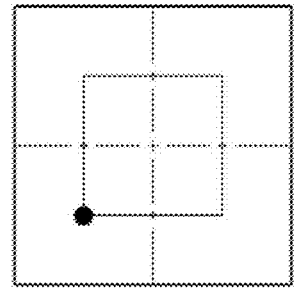
Figure 23:
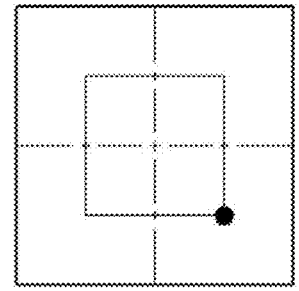
Figure 24:
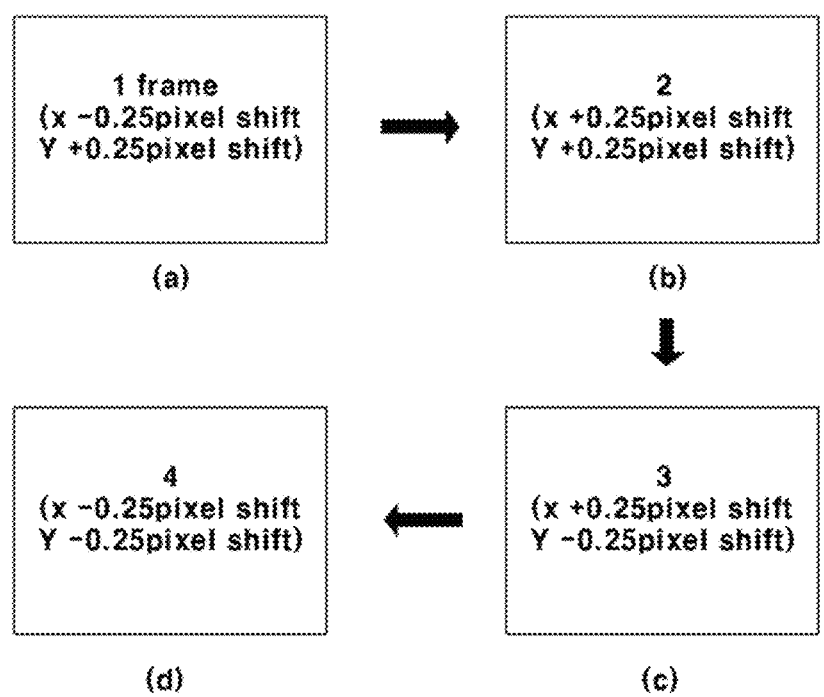
FIG. 24 is a schematic view sequentially illustrating images of first to fourth frames acquired for SR technique in a camera module according to an exemplary embodiment of the present invention.

FIG. 23 is a conceptual view sequentially and conceptually illustrating a plurality of images acquired for an SR (Super Resolution) technique in a camera module according to an exemplary embodiment of the present invention, and FIG. 24 is a schematic view sequentially illustrating images of first to fourth frames acquired for SR technique in a camera module according to an exemplary embodiment of the present invention.

The SR (Super Resolution) technique in the present exemplary embodiment is a principle of increasing resolution by obtaining an additional image through a diagonal tilting of filter (20). A dotted area in FIG. 23(a) may be an image position captured when an image is photographed while the filter (20) is not driven about a pixel. In the present exemplary embodiment, the resolution can be increased four times by acquiring a total of four frames through obtainment of one frame for each direction through four-direction diagonal tilting of filter (20). At this time, the four-direction diagonal tilting of filter (20) may be in the order of upper left, upper right, lower right and lower left. In the present exemplary embodiment, an actuator can be designed to allow the filter (20) to perform the diagonal tilting for abovementioned control. To be more specific, as shown in FIG. 23(b), control may be provided to allow an upper left of filter (20) to be upwardly tilted and to allow acquiring an image of first frame that is shifted by −0.25 pixel to x direction from the sensor, and shifted to y direction by +0.25 pixel (See FIG. 24(a)). At this time, the lower right portion of filter (20) may be downwardly tilted. Subsequently, as illustrated in FIG. 23(c), control may be provided to allow a upper right portion of filter (20) to be upwardly tilted, to obtain an image of second frame that is shifted from the sensor (30) by +0.25 pixel to x direction, and that is shifted to y direction by +0.25 pixel (See FIG. 24(b)). At this time, a lower left portion of filter (20) may be downwardly tilted. Thereafter, as shown in FIG. 23(d), control may be provided to allow obtaining an image of third frame where a lower right portion is upwardly tilted to x direction from the sensor (30) by +0.25 pixel and shifted to y direction by −0.25 pixel (See FIG. 24(c)). At this time, a upper left portion of filter (20) may be downwardly tilted. Subsequently, as illustrated in FIG. 23(e), control may be provided to allow a lower left portion to be upwardly tilted to acquire an image of fourth frame that is shifted to x direction from the sensor (30) by −0.25 pixel, and shifted to y direction by −0.25 pixel (See FIG. 24(d)). At this time, an upper right portion of filter (30) may be downwardly tilted.

Although, the exemplary embodiments disclosed in the drawings have been provided to assist in a comprehensive understanding of the embodiments of the invention, those of ordinary skill in the art will recognize that various changes and modifications of the embodiments described herein can be made without departing from the scope and spirit of the invention. Accordingly, it should be understood that the abovementioned exemplary embodiments are all exemplary and not to be limited.

The invention claimed is:

1. A camera module comprising:
a housing;
an elastic member connected to the housing;
a holder connected to the elastic member;
a magnet disposed on the holder;
a coil facing the magnet;
a lens module coupled with the housing; and
a filter coupled with the holder,
wherein the magnet comprises a first magnet, a second magnet disposed opposite to the first magnet, a third magnet, and a fourth magnet disposed opposite to the third magnet,
wherein the coil comprises a first coil facing the first magnet, a second coil facing the second magnet, a third coil facing the third magnet, and a fourth coil facing the fourth magnet,
wherein the first to fourth coils are independently applied with a current,
wherein the filter is tilted in a diagonal direction by controlling a current applied to the first and third coils,
wherein the holder comprises a first lateral surface, a second lateral surface disposed opposite to the first lateral surface, and a third lateral surface and a fourth lateral surface disposed opposite to each other between the first and second lateral surfaces,
wherein the first magnet is disposed on the first lateral surface of the holder, the second magnet is disposed on the second lateral surface of the holder, the third magnet is disposed on the third lateral surface of the holder, and the fourth magnet is disposed on the fourth lateral surface of the holder, and
wherein the first to fourth coils are coupled with the housing.

2. The camera module of claim 1, wherein the filter is so disposed as to be tilted in the diagonal direction of the filter by a current applied to adjacent two coils among the first to fourth coils.

3. The camera module of claim 1, wherein the holder comprises a first corner part disposed between the first lateral surface and the third lateral surface, a second corner part disposed between the second lateral surface and the third lateral surface, a third corner part disposed between the second lateral surface and the fourth lateral surface, and a fourth corner part disposed between the fourth lateral surface and the first lateral surface,
wherein the filter comprises a first corner disposed at a position corresponding to that of the first corner part of the holder, and
wherein the first corner of the filter is tilted upward of an optical axis by the first coil and the third coil.

4. The camera module of claim 3, wherein the filter comprises a third corner disposed at a position corresponding to that of the third corner part of holder,
wherein the third corner of the filter is tilted downward of an optical axis by the second coil and the fourth coil, and
wherein the first corner of filter is further tilted upward of the optical axis by the second coil and the fourth coil.

5. The camera module of claim 1, wherein the filter is so disposed as to be tilted in the diagonal direction of the filter by two adjacent coils among the first to fourth coils applied with a forward current and the other remaining coils applied with a reverse current.

6. The camera module of claim 1, wherein the elastic member comprises an upper elastic member comprising a first coupling part coupled to an upper portion of the holder, a second coupling part coupled to an upper portion of the housing, and a connection part connecting the first coupling part and the second coupling part,
wherein the first coupling part of the upper elastic member is coupled to a corner of the holder, and
wherein the second coupling part of the upper elastic member is coupled to a corner of the housing corresponding to another corner of the holder adjacent to the corner of the holder.

7. The camera module of claim 6, wherein the elastic member comprises a lower elastic member comprising a first coupling part coupled to a lower portion of the holder, a second coupling part coupled to a lower portion of the housing, and a connection part connecting the first coupling part and the second coupling part, and
wherein the first coupling part of the lower elastic member is coupled with the another corner of the holder.

8. The camera module of claim 6, wherein the first coupling part of the elastic member comprises two first coupling parts,
wherein the two first coupling parts are symmetrically disposed to an optical axis in a first diagonal direction of the filter,
wherein the second coupling part of the elastic member comprises two second coupling parts, and
wherein the two second coupling parts are symmetrically disposed to the optical axis in a second diagonal direction different from the first diagonal direction of the filter.

9. The camera module of claim 6, wherein the holder comprises a first corner between the first lateral surface and the third lateral surface, a second corner between the second lateral surface and the third lateral surface, a third corner between the second lateral surface and the fourth lateral surface, and a fourth corner between the fourth lateral surface and the first lateral surface,
- wherein the housing comprises a first corner corresponding to the first corner of the holder, a second corner corresponding to the second corner of the holder, a third corner corresponding to the third corner of the holder, and a fourth corner corresponding to the fourth corner of the holder,
- wherein the first coupling part of the elastic member is coupled to each of the first corner of the holder and the third corner of the holder, and
- wherein the second coupling part of the elastic member is coupled to each of the second corner of the housing and the fourth corner of the housing.

10. The camera module of claim 6, wherein the housing comprises an inner part coupled to the lens module, an outer part on which the coil is disposed, and a connection part that connects the inner part and the outer part and at least partially overlaps with the holder in an optical axis direction.

11. The camera module of claim 10, wherein the connecting part of the housing is disposed above a part of the holder,
- wherein the housing comprises a hole formed in a first diagonal direction of the filter,
- wherein the holder comprises a protrusion formed on the upper surface of the holder and passing through the hole, and
- wherein the protrusion of the holder is coupled to the first coupling part.

12. The camera module of claim 11, wherein the holder comprises a groove on an upper surface of the holder formed about the protrusion,
- wherein the housing comprises a first surface at an inside of the protrusion to face the protrusion, and
- wherein the first surface of housing is formed with a recess part having a curvature corresponding to that of the protrusion.

13. The camera module of claim 10, wherein mutually facing and parallel disposed tapered surfaces are formed at a lower end of the inner part of housing and at a corresponding part of the holder.

14. The camera module of claim 1, wherein the magnet is more protruded than an outer surface of holder.

* * * * *